(12) United States Patent
Park et al.

(10) Patent No.: US 11,289,790 B2
(45) Date of Patent: Mar. 29, 2022

(54) ELECTRONIC DEVICE INCLUDING ANTENNA MODULE HAVING HEAT TRANSFER MEMBER EXTENDING THEREFROM

(71) Applicant: Samsung Electronics Co., Ltd., Suwon-si (KR)

(72) Inventors: Jungmin Park, Suwon-si (KR); Chonghwa Seo, Suwon-si (KR); Dongil Son, Suwon-si (KR); Jongwon Lee, Suwon-si (KR); Sangwon Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 6 days.

(21) Appl. No.: 17/025,096

(22) Filed: Sep. 18, 2020

(65) Prior Publication Data

US 2021/0091450 A1 Mar. 25, 2021

(30) Foreign Application Priority Data

Sep. 19, 2019 (KR) .......................... 10-2019-0115535

(51) Int. Cl.
*H01Q 1/02* (2006.01)
*H01Q 21/00* (2006.01)
(Continued)

(52) U.S. Cl.
CPC ............. *H01Q 1/02* (2013.01); *H01Q 1/2283* (2013.01); *H01Q 1/38* (2013.01); *H01Q 21/00* (2013.01);
(Continued)

(58) Field of Classification Search
None
See application file for complete search history.

(56) References Cited

U.S. PATENT DOCUMENTS 9,609,787 B2 3/2017 Rhee
10,056,922 B1 8/2018 Tsvelykh et al.
(Continued)

FOREIGN PATENT DOCUMENTS

KR 10-1137581 B1 4/2012
KR 10-2017-0097541 A 8/2017
(Continued)

OTHER PUBLICATIONS

International Search Report dated Jan. 15, 2021, issued in International Application No. PCT/KR2020/012637.

*Primary Examiner* — David E Lotter
(74) *Attorney, Agent, or Firm* — Jefferson IP Law, LLP

(57) ABSTRACT

An electronic device is provided. The electronic device includes a housing, an antenna module disposed along an inner wall of the housing, and a heat dissipation member disposed inside the housing. The antenna module may include a first circuit board including a plurality of layers, wherein the plurality of layers include a plurality of conductive layers and a plurality of non-conductive layers, and the conductive layer and the non-conductive layer are alternately stacked, at least one integrated circuit mounted on the first circuit board, an antenna array disposed on any one of the plurality of layers and electrically coupled with the at least one integrated circuit, and a heat transfer member including a conductive member extending from any one conductive layer among the plurality of conductive layers and a non-conductive member surrounding, at least in part, the conductive member.

20 Claims, 16 Drawing Sheets

(51) Int. Cl.
*H01Q 1/22* (2006.01)
*H05K 1/02* (2006.01)
*H01Q 1/38* (2006.01)

(52) U.S. Cl.
CPC ......... *H05K 1/0206* (2013.01); *H05K 1/0298* (2013.01); *H05K 2201/10098* (2013.01)

(56) References Cited

U.S. PATENT DOCUMENTS

| | | |
|---|---|---|
| 2018/0090411 A1 | 3/2018 | Cetegen et al. |
| 2018/0198487 A1* | 7/2018 | Kim .................... H05K 7/2039 |
| 2018/0284856 A1 | 10/2018 | Shah |
| 2019/0004576 A1 | 1/2019 | Ho et al. |
| 2019/0252757 A1 | 8/2019 | Baek et al. |
| 2020/0367383 A1* | 11/2020 | Moon .................... G06F 1/203 |

FOREIGN PATENT DOCUMENTS

| | | |
|---|---|---|
| KR | 10-2018-0024674 A | 3/2018 |
| KR | 10-2019-0060074 A | 6/2019 |
| KR | 10-2019-0060180 A | 6/2019 |
| KR | 10-2020-0054826 A | 5/2020 |
| KR | 10-2147792 B1 | 8/2020 |

\* cited by examiner

US 11,289,790 B2

ELECTRONIC DEVICE INCLUDING ANTENNA MODULE HAVING HEAT TRANSFER MEMBER EXTENDING THEREFROM

CROSS-REFERENCE TO RELATED APPLICATION(S)

This application is based on and claims priority under 35 U.S.C. § 119(a) of a Korean patent application number 10-2019-0115535, filed on Sep. 19, 2019, in the Korean Intellectual Property Office, the disclosure of which is incorporated by reference herein in its entirety.

BACKGROUND

1. Field

The disclosure relates to an electronic device including an antenna module having a heat transfer member extending therefrom. More particularly, the disclosure relates to a structure for reducing heat generation of the antenna module disposed to an outer periphery of the electronic device.

2. Description of Related Art

A communication method using an mmWave antenna module for high-speed communication may have a great amount of data for performing arithmetic processing, and may include many active elements used in a radio frequency (RF) front-end. The antenna module may perform communication in such a manner that a propagation intensity and a transfer distance of a wavelength are increased to utilize a high data rate and linearity of mmWave. Heat generation may occur by active elements, such as an amplifier, a phase modulator, or the like included in the RF front-end, and heat generation may occur in a radio frequency integrated circuit (RFIC) when processing transmission/reception of a great amount of data.

The above information is presented as background information only to assist with an understanding of the disclosure. No determination has been made, and no assertion is made, as to whether any of the above might be applicable as prior art with regard to the disclosure.

SUMMARY

Heat may be generated in a process of operating an mmWave antenna module for high-speed communication. In order to improve sensitivity and antenna efficiency, the antenna module may be mounted on an outermost periphery of an electronic device to perform communication. The antenna module may include a radio frequency integrated circuit (RFIC) and a power management integrated circuit (PMIC).

High heat generated in the RFIC and PMIC through data transmission/reception processing may cause a damage to a user, such as a low-temperature burn, and may cause an anxiety when using the electronic device. Alternatively, heat generated from an integrated circuit may affect a module mounted nearby, which may deteriorate performance of the electronic device.

Aspects of the disclosure are to address at least the above-mentioned problems and/or disadvantages and to provide at least the advantages described below. Accordingly, an aspect of the disclosure is to provide a structure for reducing heat generation of an antenna module disposed to an outer periphery of the electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing, an antenna module disposed along an inner wall of the housing, and a heat dissipation member disposed inside the housing. The antenna module may include a first circuit board including a plurality of layers, wherein the plurality of layers include a plurality of conductive layers and a plurality of non-conductive layers, and the conductive layer and the non-conductive layer are alternately stacked, at least one integrated circuit mounted on the first circuit board, an antenna array disposed on any one of the plurality of layers and electrically coupled with the at least one integrated circuit, and a heat transfer member including a conductive member extending from any one conductive layer among the plurality of conductive layers and a non-conductive member surrounding, at least in part, the conductive member. The heat transfer member may be coupled to the heat dissipation member and is configured to transfer heat generated from the antenna module to the heat dissipation member.

In accordance with another aspect of the disclosure, an electronic device is provided The electronic device includes a housing, an antenna module disposed along an inner wall of the housing, a heat dissipation member spaced apart from the antenna module and disposed inside the housing, and a first circuit board disposed inside the housing and electrically coupled with the antenna module. The antenna module may include a second circuit board including a plurality of layers, wherein the plurality of layers are constructed of a plurality conductive layers and a plurality of non-conductive layers alternatively stacked with the conductive layers, at least one integrated circuit mounted on the second circuit board, an antenna array disposed to any one layer among the plurality of layers and electrically coupled with the integrated circuit, a first non-conductive layer disposed to at least one face of the any one layer to which the antenna array is disposed, a heat transfer member including a conductive member extending from any one conductive layer among the plurality of conductive layers and a non-conductive member surrounding, at least in part, the conductive member. The heat transfer member may transfer heat generated from the at least one integrated circuit to the heat dissipation member.

An electronic device including an antenna module having a heat transfer member extending therefrom according to various embodiments can reduce high heat generated in a RFIC and a PMIC through data transmission/reception processing.

The electronic device according to various embodiments can reduce heat generated in an integrated circuit, such as the RFIC and the PMIC, thereby decreasing an effect on a module mounted near the integrated circuit and improving performance of the electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
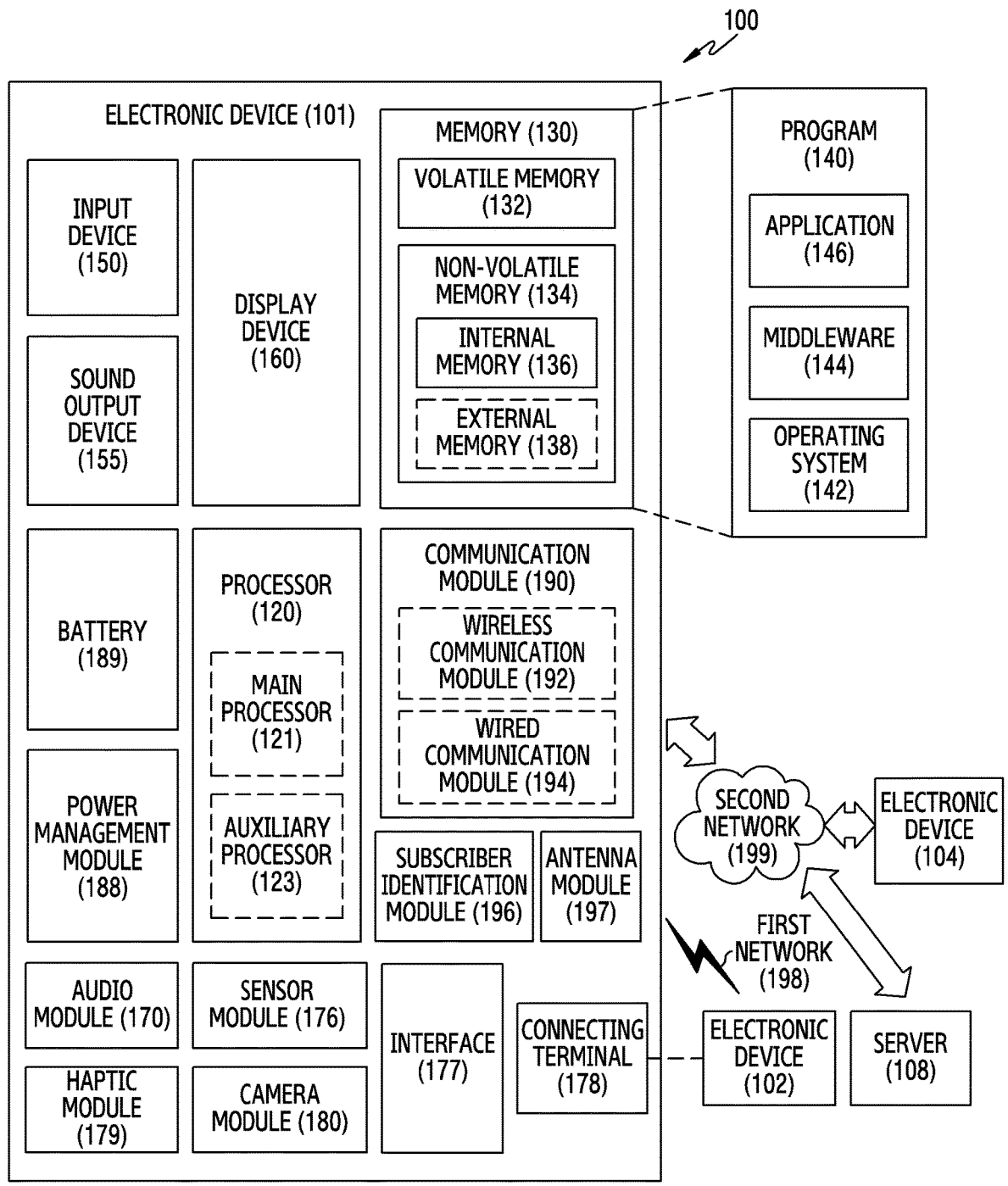
FIG. 1 is a block diagram of an electronic device in a network environment according to an embodiment of the disclosure.

FIG. 1 is a block diagram illustrating an electronic device in a network environment 100 according to an embodiment of the disclosure.

Referring to FIG. 1, an electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture an image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., a PCB). According to an embodiment of the disclosure, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
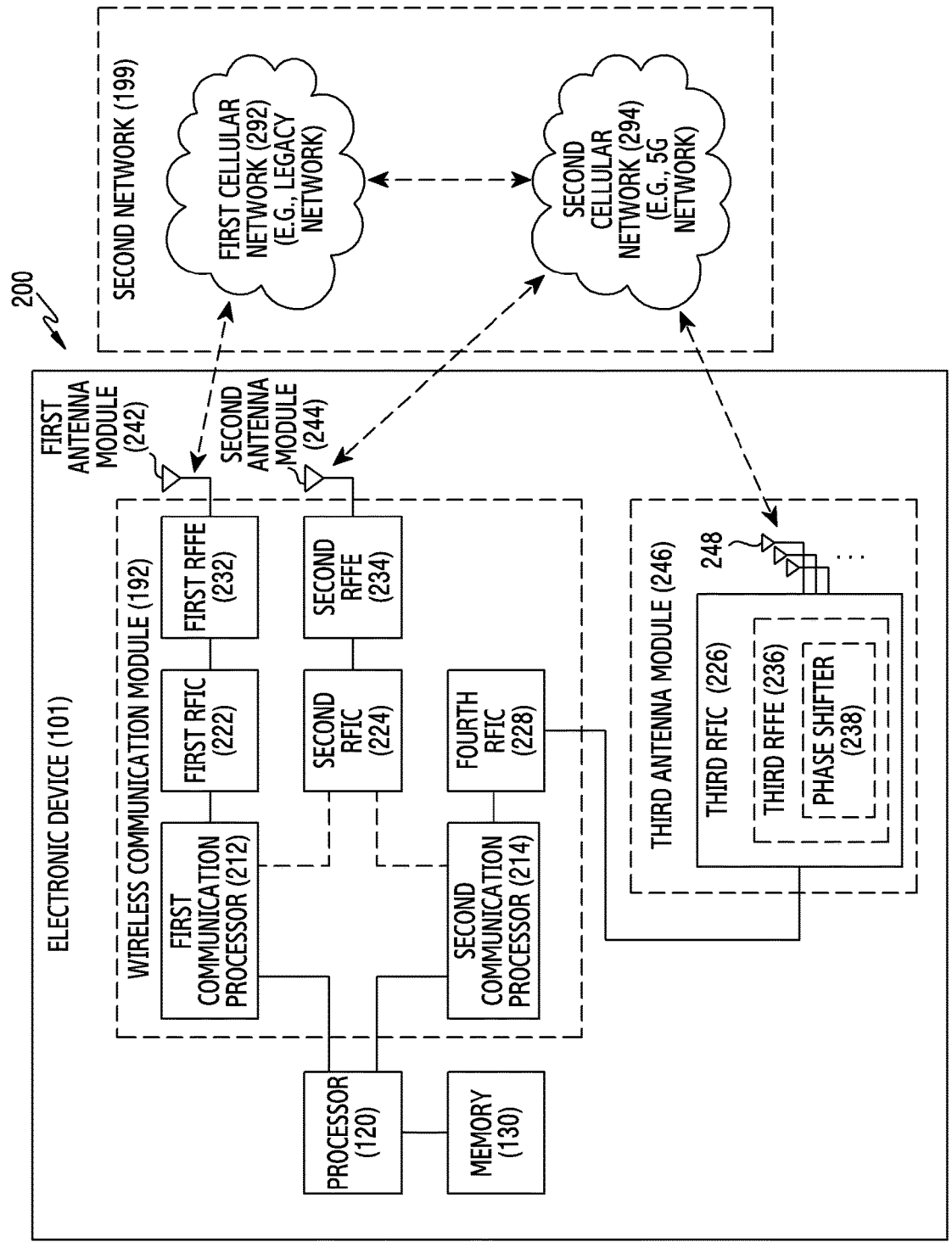
FIG. 2 is a block diagram of an electronic device in a network environment including a plurality of cellular networks according to an embodiment of the disclosure.

FIG. 2 is a block diagram 200 of an electronic device in a network environment including a plurality of cellular networks according to an embodiment of the disclosure.

Referring to FIG. 2, an electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor (e.g., including processing circuitry) 120 and a memory 130. The second network 199 may include a first cellular network 292 and a second cellular network 294. According to another embodiment of the disclosure, the electronic device may further include at least one of the parts shown in FIG. 1 and the second network 199 may further include at least one another network. According to an embodiment of the disclosure, the first communication processor 212, the second communication processor 214, the first RFIC 222, the second RFIC 224, the fourth RFIC 228, the first RFFE 232, and the second RFFE 234 may form at least a portion of a wireless communication module 192. According to another embodiment of the disclosure, the fourth RFIC 228 may be omitted or may be included as a portion of the third RFIC 226.

The first communication processor 212 can support establishment of a communication channel with a band to be used for wireless communication with the first cellular network 292 and legacy network communication through the established communication channel According to various embodiments of the disclosure, the first cellular network may be a legacy network including a 2G, 3G, 4G, or Long Term Evolution (LTE) network. The second communication processor 214 can support establishment of a communication channel corresponding to a designated band (e.g., about 6 GHz~about 60 GHz) of a band to be used for wireless communication with the second cellular network 294 and 5G network communication through the established communication channel According to various embodiments of the disclosure, the second cellular network 294 may be a 5G network that is defined in 3GPP. Further, according to an embodiment of the disclosure, the first communication processor 212 or the second communication processor 214 can support establishment of a communication channel corresponding to another designated band (e.g., about 6 GHz or less) of a band to be used for wireless communication with the second cellular network 294 and 5G network communication through the established communication channel According to an embodiment of the disclosure, the first communication processor 212 and the second communication processor 214 may be implemented in a single chip or a single package. According to various embodiments of the disclosure, the first communication processor 212 or the second communication processor 214 may be disposed in a single chip or a single package together with the processor 120, the auxiliary processor 123, or the communication module 190. According to an embodiment of the disclosure, the first communication processor 212 and the second communication processor 214 is directly or indirectly connected by an interface (not shown), thereby being able to provide or receive data or control signal in one direction or two directions.

The first RFIC 222, in transmission, can converts a baseband signal generated by the first communication processor 212 into a radio frequency (RF) signal of about 700 MHz to about 3 GHz that is used for the first cellular network 292 (e.g., a legacy network). In reception, an RF signal can be obtained from the first cellular network 292 (e.g., a legacy network) through an antenna (e.g., the first antenna module 242) and can be preprocessed through an RFFE (e.g., the first RFFE 232). The first RFIC 222 can covert the preprocessed RF signal into a baseband signal so that the preprocessed RF signal can be processed by the first communication processor 212.

The second RFIC 224 can convert a baseband signal generated by the first communication processor 212 or the second communication processor 214 into an RF signal in a Sub6 band (e.g., about 6 GHz or less) (hereafter, 5G Sub6 RF signal) that is used for the second cellular network 294 (e.g., a 5G network). In reception, a 5G Sub6 RF signal can be obtained from the second cellular network 294 (e.g., a 5G network) through an antenna (e.g., the second antenna module 244) and can be preprocessed through an RFFE (e.g., the second RFFE 234). The second RFIC 224 can convert the processed 5G Sub6 RF signal into a baseband signal so that the processed 5G Sub6 RF signal can be processed by a corresponding communication processor of the first communication processor 212 or the second communication processor 214.

The third RFIC 226 can convert a baseband signal generated by the second communication processor 214 into an RF signal in a 5G Above6 band (e.g., about 6 GHz~about 60 GHz) (hereafter, 5G Above6 RF signal) that is used for the second cellular network 294 (e.g., a 5G network). In reception, a 5G Above6 RF signal can be obtained from the second cellular network 294 (e.g., a 5G network) through an antenna (e.g., the antenna 248) and can be preprocessed through the third RFFE 236. The third RFIC 226 can covert the preprocessed 5G Above6 RF signal into a baseband signal so that the preprocessed 5G Above6 RF signal can be processed by the first communication processor 214. According to an embodiment of the disclosure, the third RFFE 236 may be provided as a portion of the third RFIC 226.

The electronic device 101, according to an embodiment of the disclosure, may include a fourth RFIC 228 separately from or as at least a portion of the third RFIC 226. In this case, the fourth RFIC 228 can convert a baseband signal generated by the second communication processor 214 into an RF signal in an intermediate frequency band (e.g., about 9 GHz~about 11 GHz) (hereafter, IF signal), and then transmit the IF signal to the third RFIC 226. The third RFIC 226 can convert the IF signal into a 5G Above6 RF signal. In reception, a 5G Above6 RF signal can be received from the second cellular network 294 (e.g., a 5G network) through an antenna (e.g., the antenna 248) and can be converted into an IF signal by the third RFIC 226. The fourth RFIC 228 can covert the IF signal into a baseband signal so that IF signal can be processed by the second communication processor 214.

According to an embodiment of the disclosure, the first RFIC 222 and the second RFIC 224 may be implemented as at least a portion of a single chip or a single package. According to an embodiment of the disclosure, the first RFFE 232 and the second RFFE 234 may be implemented as at least a portion of a single chip or a single package. According to an embodiment of the disclosure, at least one of the first antenna module 242 or the second antenna module 244 may be omitted, or may be combined with another antenna module and can process RF signals in a plurality of bands.

According to an embodiment of the disclosure, the third RFIC 226 and the antenna 248 may be disposed on a substrate, thereby being able to form a third antenna module 246. For example, the wireless communication module 192 or the processor 120 may be disposed on a first substrate (e.g., a main PCB). In this case, the third RFIC 226 may be disposed in a partial area (e.g., the bottom) and the antenna 248 may be disposed in another partial area (e.g., the top) of a second substrate (e.g., a sub PCB) that is different from the first substrate, thereby being able to form the third antenna module 246. By disposing the third RFIC 226 and the antenna 248 on the same substrate, it is possible to reduce the length of the transmission line therebetween. Accordingly, it is possible to reduce a loss (e.g., attenuation) of a signal in a high-frequency band (e.g., about 6 GHz~about 60 GHz), for example, which is used for 5G network communication, due to a transmission line. Accordingly, the electronic device 101 can improve the quality and the speed of communication with the second cellular network 294 (e.g., 5G network).

According to an embodiment of the disclosure, the antenna 248 may be an antenna array including a plurality of antenna elements that can be used for beamforming. In this case, the third RFIC 226, for example, as a portion of the third RFFE 236, may include a plurality of phase shifters 238 corresponding to the antenna elements. In transmission, the phase shifters 238 can convert the phase of a 5G Above6 RF signal to be transmitted to the outside of the electronic device 101 (e.g., to a base station of a 5G network) through the respectively corresponding antenna elements. In reception, the phase shifters 238 can convert the phase of a 5G Above6 RF signal received from the outside through the respectively corresponding antenna element into the same or substantially the same phase. This enables transmission or reception through beamforming between the electronic device 101 and the outside.

The second cellular network 294 (e.g., a 5G network) may be operated independently from (e.g., Stand-Along (SA)) or connected and operated with (e.g., Non-Stand Along (NSA)) the first cellular network 292 (e.g., a legacy network). For example, there may be only an access network (e.g., a 5G radio access network (RAN) or a next generation RAN (NG RAN)) and there is no core network (e.g., a next generation core (NGC)) in a 5G network. In this case, the electronic device 101 can access the access network of the 5G network and then can access an external network (e.g., the internet) under control by the core network (e.g., an evolved packed core (EPC)) of the legacy network. Protocol information (e.g., LTE protocol information) for communication with a legacy network or protocol information (e.g., New Radio (NR) protocol information) for communication with a 5G network may be stored in the memory 230 and accessed by another part (e.g., the processor 120, the first communication processor 212, or the second communication processor 214).

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively, or additionally, a plurality of components (e.g., modules or programs) may be integrated into a single component. In such a case, according to various embodiments of the disclosure, the integrated component may perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 3A:
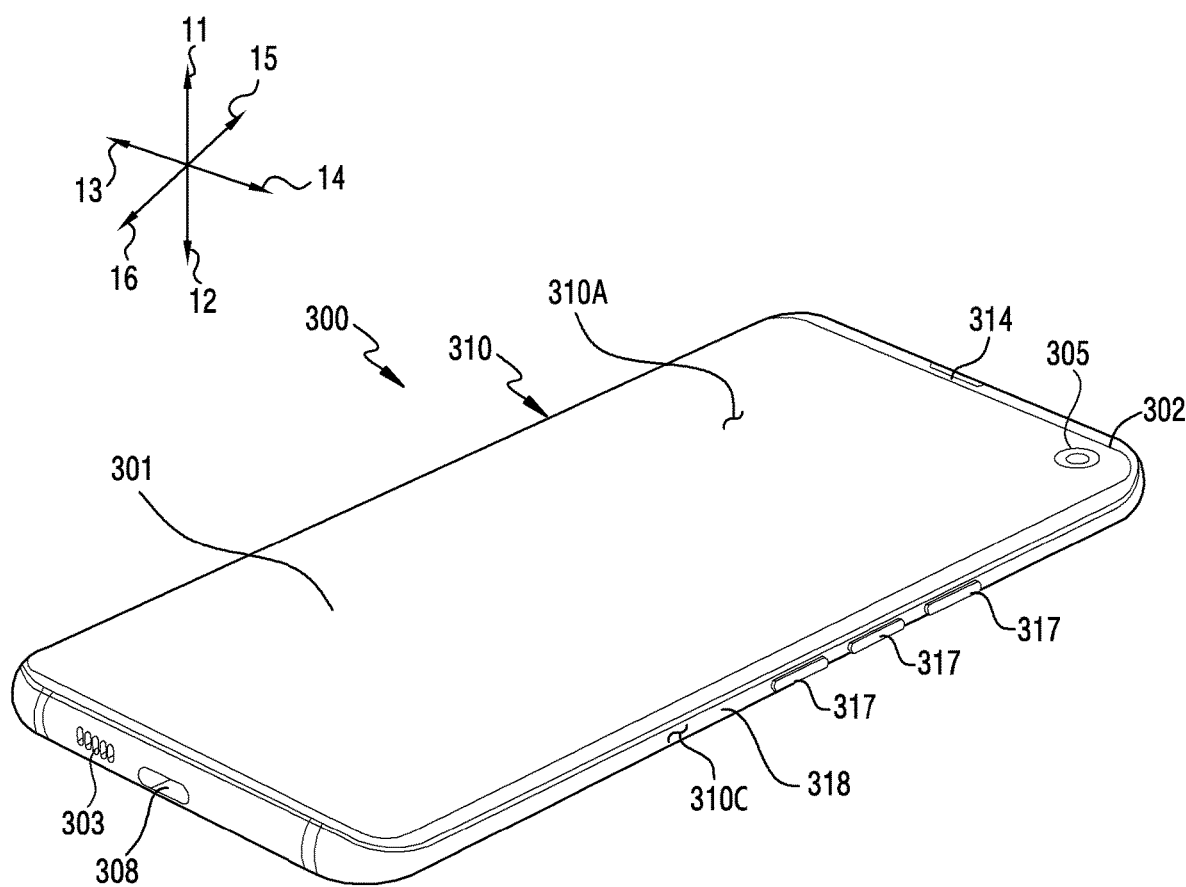
FIG. 3A is a perspective view illustrating an electronic device according to an embodiment of the disclosure.
Figure 3B:
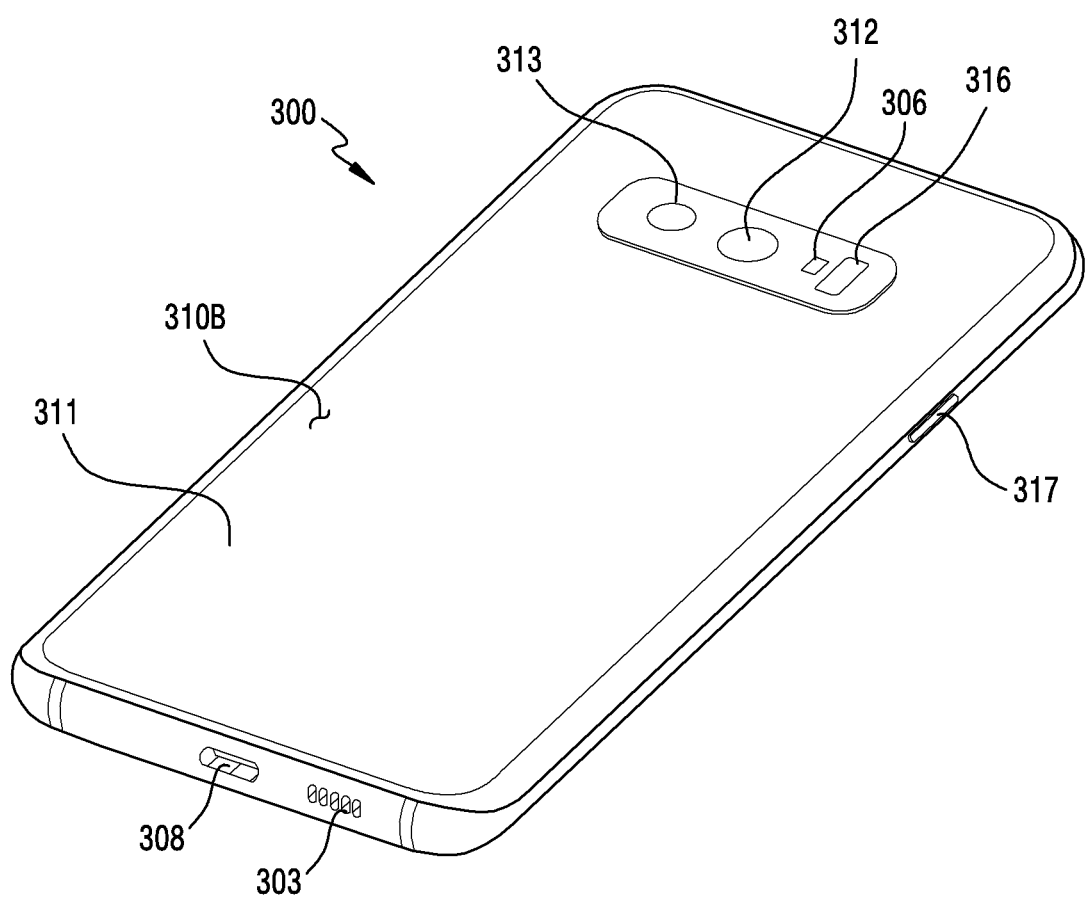
FIG. 3B is a perspective view illustrating an electronic device of FIG. 3A, viewed from a back side according to an embodiment of the disclosure.

FIG. 3A is a perspective view illustrating an electronic device according to an embodiment of the disclosure. FIG. 3B is a perspective view illustrating an electronic device of FIG. 3A, viewed from a back side according to an embodiment of the disclosure.

Referring to FIG. 3A and FIG. 3B, an electronic device 300 according to an embodiment may include a housing 310 including a first face (or a front face) 310A, a second face (or a rear face) 310B, and a side face 310C surrounding a space between the first face 300A and the second face 310B. In another embodiment (not shown), the housing may refer to a construction which constitutes part of the first face 310A, second face 310B, and third face 310C of FIG. 3A and FIG. 3B.

According to an embodiment of the disclosure, the first face 310A may be constructed of a front plate 302 (e.g., a polymer plate or a glass plate having various coating layers) which is at least partially transparent in practice. According to an embodiment of the disclosure, the front plate 302 may include a curved portion seamlessly extending by being bent from the first face 310A toward a rear plate 311 in at least one side edge portion.

According to an embodiment of the disclosure, the second face 310B may be constructed of the rear plate 311 which is opaque in practice. For example, the rear plate 311 may be constructed of coated or colored glass, ceramic, polymer, metallic materials (e.g., aluminum, stainless steel (STS), or magnesium) or a combination of at least two of these materials. According to an embodiment of the disclosure, the rear plate 311 may include a curved portion seamlessly extending by being bent from the second face 310B toward the front plate 302 in at least one side edge portion.

According to an embodiment of the disclosure, the side face 310C may be constructed of a side bezel structure (or a side member or a side wall) 318 bonded to the front plate 302 and the rear plate 311 and including metal and/or polymer. In some embodiments of the disclosure, the rear plate 311 and the side bezel structure 318 may be constructed integrally and may include the same material (e.g., a metallic material, such as aluminum).

According to an embodiment of the disclosure, the electronic device 300 may include at least one or more of a display 301, audio modules 303 and 314, a sensor module, a camera module 305, a key input device 317, and a connector hole 308. In some embodiments of the disclosure, the electronic device 300 may omit at least one of components (e.g., the key input device 317), or other components may be additionally included. For example, the electronic device 300 may include a sensor module (not shown). For example, a sensor, such as a proximity sensor or an illumination sensor may be integrated to the display 301 in a region provided by the front plate 302, or may be disposed at a location adjacent to the display 301. In some embodiments of the disclosure, the electronic device 300 may further include a light emitting element, and the light emitting element may be disposed at a location adjacent to the display 301 in the region provided by the front plate 302. The light emitting element may provide, for example, state information of the electronic device 300 in an optical form. In another embodiment of the disclosure, the light emitting element may provide, for example, a light source interworking with an operation of the camera module 305. The light emitting element may include, for example, an LED, an IR LED, and a xenon lamp.

The display 301 may be exposed through, for example, some portions of the front plate 302. In some embodiments of the disclosure, an edge of the display 301 may be constructed to be substantially the same as a shape of an outer periphery (e.g., a curved face) adjacent to the front plate 302. In another embodiment (not shown), in order to expand an area in which the display 301 is exposed, the display 310 and the front plate 302 may be constructed to have substantially the same interval between outer peripheries thereof. In another embodiment (not shown), a portion of a screen display region of the display 301 may have a recess or opening, and may include other electronic components, for example, the camera module 305 and a proximity sensor or illumination sensor (not shown), which are aligned with the recess or the opening.

In another embodiment (not shown), at least one of camera modules 312 and 313, a finger print sensor 316, and a flash 306 may be included in a rear face of the screen display region of the display 301. In another embodiment (not shown), the display 301 may be disposed adjacent to or joined with a touch sensing circuit, a pressure sensor capable of measuring touch strength (pressure), and/or a digitizer for detecting a magnetic-type stylus pen.

The audio modules 303 and 314 may include a microphone hole and a speaker hole. The microphone hole may have a microphone disposed inside thereof to acquire external sound, and in some embodiments of the disclosure, may have a plurality of microphones disposed to detect a sound direction. In some embodiments of the disclosure, the speaker hole and the microphone hole may be implemented with one hole 303, or the speaker (e.g., a piezo speaker) may be included without the speaker hole. The speaker hole may include the external speaker hole and the communication receiver hole 314.

The electronic device 300 includes a sensor module (not shown) to generate an electrical signal or data value corresponding to an internal operational state or an external environmental state. The sensor module may further include a proximity sensor disposed adjacent to the first face 310A of the housing 310, a fingerprint sensor disposed integrally or adjacent to the display 301, and or a biometric sensor (e.g., a heart rate monitoring (HRM) sensor) disposed to the second face 310B of the housing 310. The electronic device 300 may further include at least one of senor modules (not shown), for example, a gesture sensor, a gyro sensor, an atmospheric pressure sensor, a magnetic sensor, an acceleration sensor, a grip sensor, a color sensor, an Infrared (IR) sensor, a biometric sensor, a temperature sensor, a humidity sensor, and an illuminance sensor.

The camera modules 305, 312, 313, and 306 may include the first camera device 305 disposed to the first face 310A of the electronic device 300, the second camera device 312 disposed to the second face 310B, and/or the flash 313. The camera devices 305, 312, and 313 may include one or more lenses, an image sensor, and/or an image signal processor. The flash 306 may include, for example, a Light Emitting Diode (LED) or a xenon lamp. In some embodiments of the disclosure, two or more lenses (wide angle and telephoto lenses) and image sensors may be disposed to one face of the electronic device 300.

The key input device 317 may be disposed to the side face 310C of the housing 310. In another embodiment of the disclosure, the electronic device 300 may not include the entirety or part of the aforementioned key input device 317. The key input device 317, which is not included, may be implemented on the display 301 in a different form, such as a soft key or the like. In some embodiments of the disclosure, the key input device may include at least part of the fingerprint sensor 316 disposed to the second face 310B of the housing 310.

The connector hole 308 may accommodate a connector for transmitting/receiving power and/or data of an external electronic device and/or a connector for transmitting/receiving an audio signal with respect to the external electronic device. For example, the connector hole 308 may include a USB connector or an earphone jack.

Figure 4A:
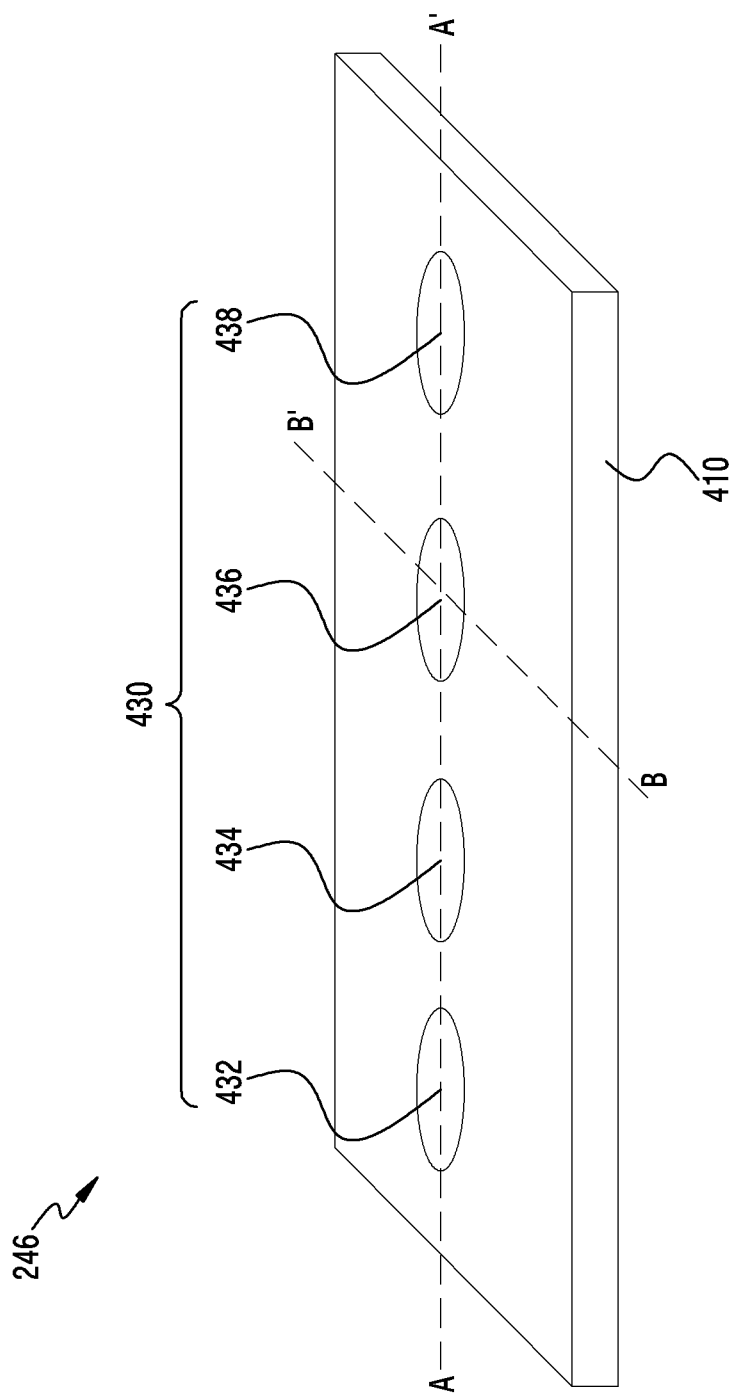
FIG. 4A is a perspective view of a third antenna module, viewed from one side according to an embodiment of the disclosure.
Figure 4B:
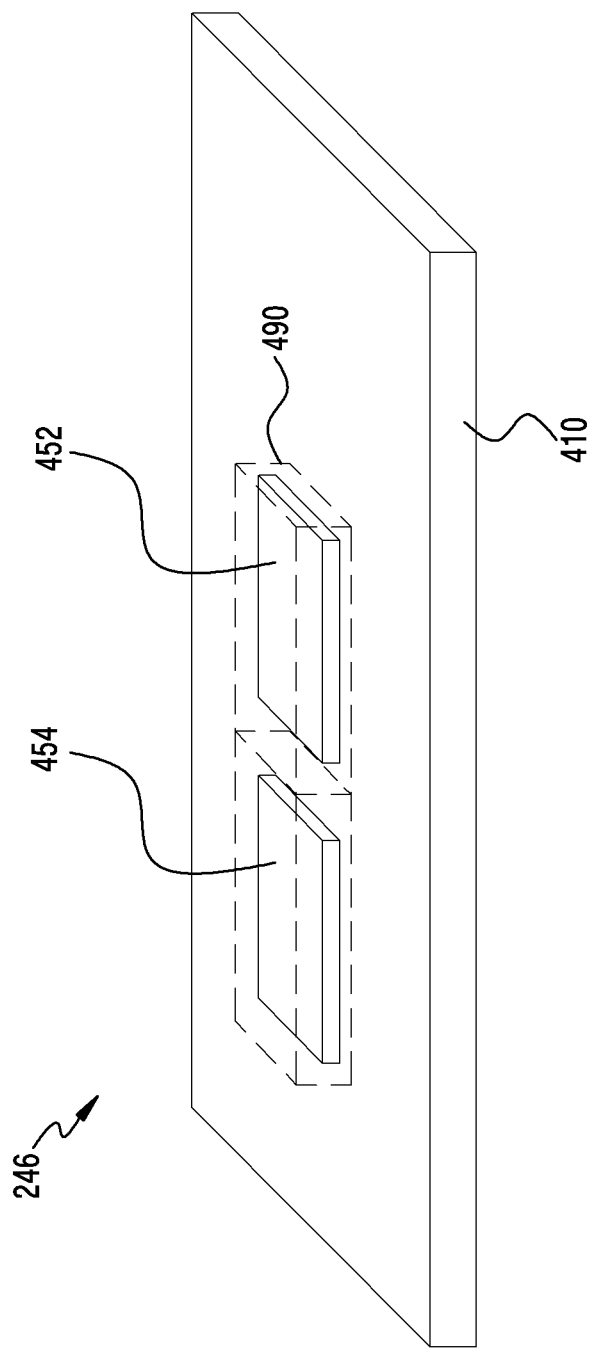
FIG. 4B is a perspective view of a third antenna module, viewed from the other side according to an embodiment of the disclosure.
Figure 4C:
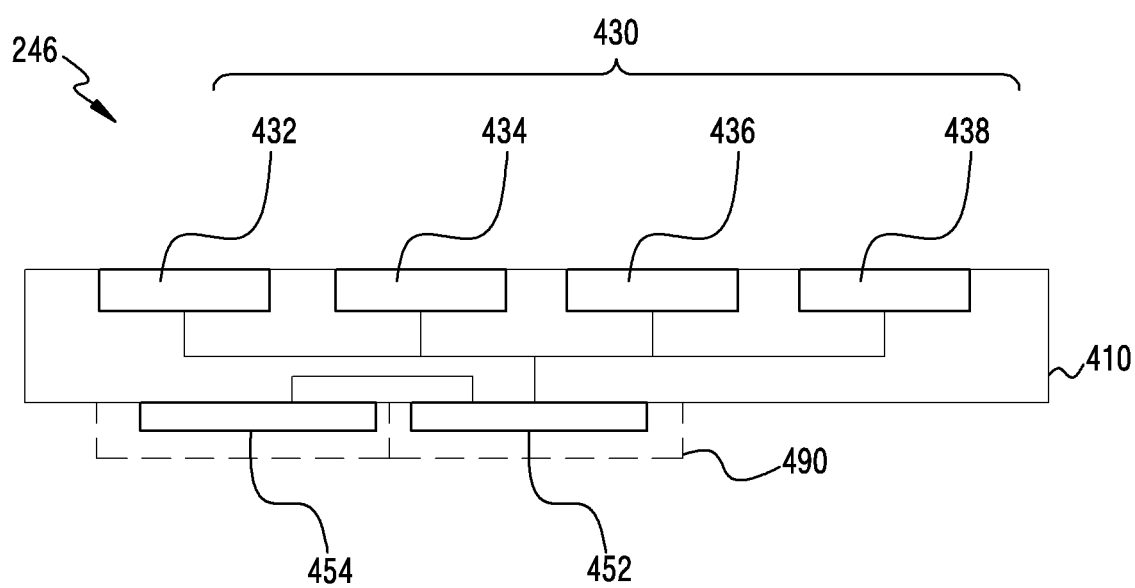
FIG. 4C is a cross-sectional view of a third antenna module, cut along the line A-A' according to an embodiment of the disclosure.

FIG. 4A, FIG. 4B, and FIG. 4C illustrate, for example, an embodiment of a structure of the third antenna module 246 described with reference to FIG. 2. FIG. 4A is a perspective view of a third antenna module, viewed from one side, and FIG. 4B is a perspective view of a third antenna module, viewed from the other side. FIG. 4C is a cross-sectional view of a third antenna module, cut along the line A-A' according to various embodiments of the disclosure.

Referring to FIG. 4A, FIG. 4B, and FIG. 4C, in an embodiment of the disclosure, the third antenna module 246 may include a printed circuit board (PCB) 410, an antenna array 430, a radio frequency integrated circuit (RFIC) 452, a power management integrated circuit (PMIC) 454, and a module interface 470. Optionally, the third antenna module 246 may further include a shielding member 490. In other embodiments of the disclosure, at least one of the aforementioned components may be omitted, or at least two of the components may be integrally constructed.

The PCB 410 may include a plurality of conductive layers and a plurality of non-conductive layers stacked alternately with the conductive layers. The PCB 410 may provide an electrical connection between various electronic components disposed outside or on the PCB 410 by using wirings and conductive vias constructed on the conductive layer.

The antenna array 430 (e.g., 248 of FIG. 2) may include a plurality of antenna elements 432, 434, 436, and 438 disposed to form a directivity beam. The antenna elements may be constructed on a first face of the PCB 410 as illustrated. According to another embodiment of the disclosure, the antenna array 430 may be constructed inside the PCB 410. According to embodiments of the disclosure, the antenna array 430 may include a plurality of antenna arrays (e.g., a dipole antenna array and/or a patch antenna array) of the same or different shape or type.

The RFIC 452 (e.g., 226 of FIG. 2) may be disposed on another region (e.g., a second face opposite to the first face) of the PCB 410, spaced apart from the antenna array. The RFIC is configured to process a signal of a selected frequency band, transmitted/received through the antenna array 430. According to an embodiment of the disclosure, in a transmission operation, the RFIC 452 may convert a baseband signal acquired from a communication processor (not shown) into an RF signal of a specified band. In a reception operation, the RFIC 452 may convert an RF signal received through the antenna array 430 into a baseband signal and transmit it to the communication processor.

According to another embodiment of the disclosure, in a transmission operation, the RFIC 452 may up-convert an IF signal (e.g., about 9 GHz to 11 GHz) acquired from an intermediate frequency integrated circuit (IFIC) (e.g., 228 of FIG. 2) into an RF signal of a selected band. In a reception operation, the RFIC 452 may down-convert an RF signal acquired through the antenna array 430 into an IF signal and transmit it to the IFIC.

The PMIC 454 may be disposed to some other regions (e.g., the second face) of the PCB 410, spaced apart from the antenna array. Voltage is provided from a main PCB (not shown), and thus the PMIC may provide power required for various components (e.g., the RFIC 452) on the antenna module.

The shielding member 490 may be disposed on a portion (e.g., the second face) of the PCB 410 to electrically shield at least one of the RFIC 452 and the PMIC 454. According to an embodiment of the disclosure, the shielding member 490 may include a shield can.

Although not shown, in various embodiments of the disclosure, the third antenna module 246 may be electrically coupled with another PCB (e.g., a main circuit board) through a module interface. The module interface may include a connection member, for example, a coaxial cable connector, a board to board connector, an interposer, or a flexible printed circuit board (FPCB). Through the connection member, the RFIC 452 and/or PMIC 454 of the antenna module may be electrically coupled to the PCB.

Figure 5:
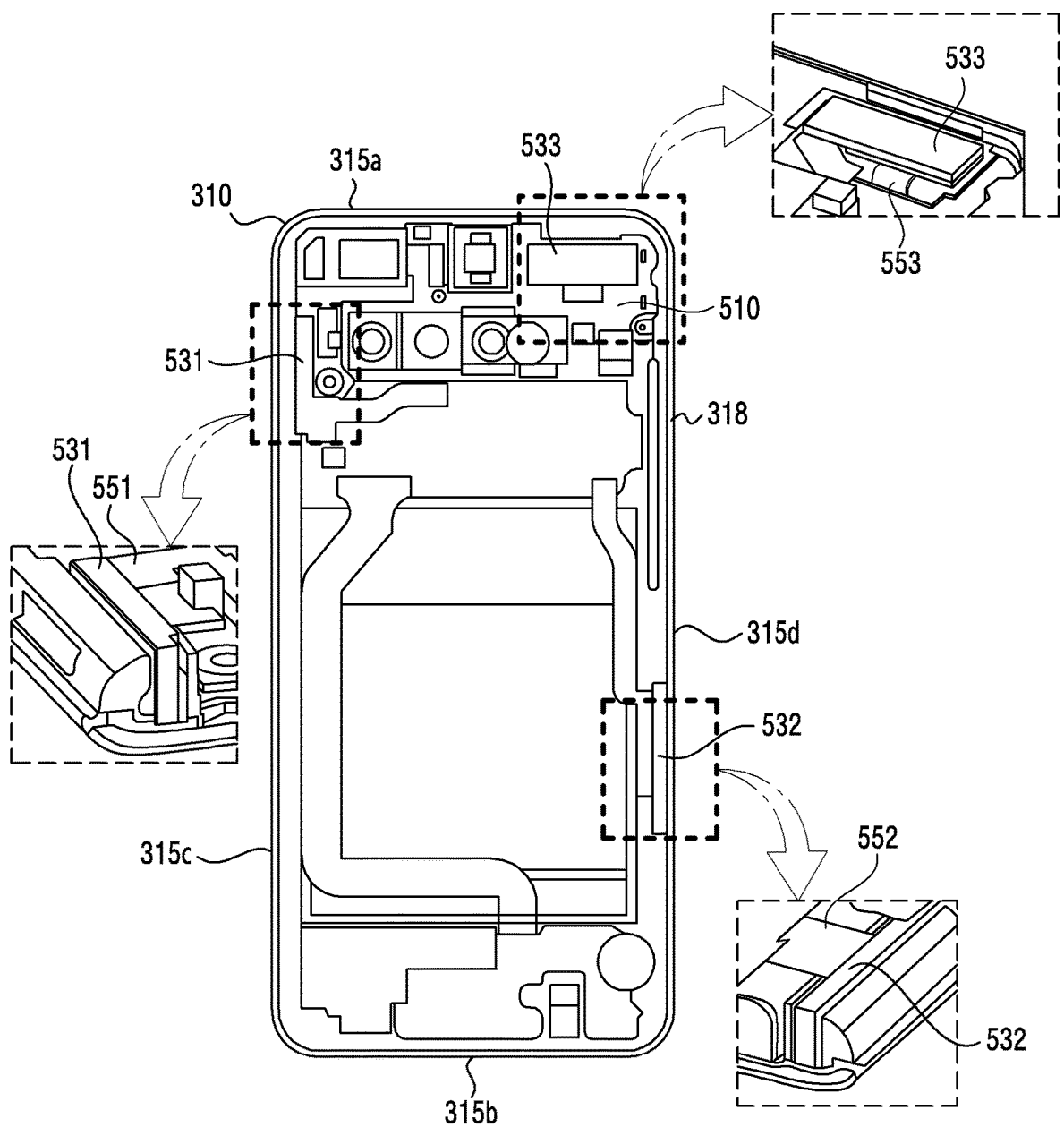
FIG. 5 illustrates an arrangement of an antenna array inside an electronic device according to an embodiment of the disclosure.

FIG. 5 illustrates an arrangement of an antenna array inside an electronic device according to an embodiment of the disclosure.

Referring to FIG. 5, the electronic device 300 may include a first antenna array 531, a second antenna array 532, and a third antenna array 533. The first antenna array 531, the second antenna array 532, and the third antenna array 533 may be included a housing or an inner space of the side bezel structure 318.

According to an embodiment of the disclosure, the side bezel structure 318 may include a first edge 315a, a second edge 315b, a third edge 315c, and a fourth edge 315d. The first edge 315a of the side bezel structure 318 may construct part of a side face (e.g., the side face 310C of FIGS. 3A and 3B) of the housing. For example, the first edge 315a may be an edge extending along an upper portion of the housing 310. The second edge 315b may face the first edge 315a, and may extend in parallel with the first edge 315a to construct part of the housing 310 (e.g., a lower portion of the housing 310). The third edge 315c may extend from one end of the first edge 315a to one end of the second edge 315b, and may be constructed to be substantially vertical to the first edge 315a and the second edge 315b. The fourth edge 315d may extend in parallel with the third edge 315c, from the other end of the first edge 315a towards the other end of the second edge 315b. The first edge 315a and the second edge 315b may be constructed to be shorter than the third edge 315c and the fourth edge 315d.

According to an embodiment of the disclosure, the first antenna array 531 and the second antenna array 532 may be vertically mounted on an inner space (e.g., an inner space of the housing 310) constructed by the side bezel structure 318. According to an embodiment of the disclosure, in order to secure a space for mounting an electronic component (e.g., a battery) inside the housing 310 and to secure radiation performance of the first antenna array 531 and second antenna array 532, the first antenna array 531 and the second antenna array 532 may be disposed such that a face having a wide width faces the side face 310C. For example, a face having the first and second antenna arrays 531 and 532 constructed thereon may be disposed to face the side face 310C.

According to an embodiment of the disclosure, the first antenna array 531 and the second antenna array 532 may be disposed to a long edge of the side bezel structure 318. For example, the first antenna array 531 may be disposed to the third edge 315c of the side bezel structure 318, and the second antenna array 532 may be disposed to the fourth edge 315d of the side bezel structure 318. According to an embodiment of the disclosure, the first antenna array 531 may be disposed to be displaced from the second antenna array 532. For example, the first antenna array 531 may be disposed to the third edge 315c at a position much closer to the first edge 315a, and the second antenna array 532 may be disposed to the fourth edge 315d at a position much close to the second edge 315b.

According to an embodiment of the disclosure, the third antenna array 533 may be disposed to a short edge of a side member. For example, the third antenna array 533 may be disposed to the first edge 315a of the side bezel structure 318. The third antenna array 533 may be disposed near a vertex constructed by the first edge 315a and the fourth edge 315d. The side bezel structure 318 may include a segmented portion, and may serve as a legacy antenna.

According to an embodiment of the disclosure, an antenna module (e.g., the third antenna module 246 of FIG. 4A to FIG. 4C) including the first antenna array 531 and the second antenna array 532 may be vertically mounted, so that a face having the first and second antenna arrays 531 and 532 disposed thereon faces the side face 310c of the housing 310. The antenna module including the first antenna array 531 and the second antenna array 532 may include heat dissipation layers 551 and 552 extending from part of a face facing the front plate. The heat dissipation layers 551 and 552 may be constructed of a soft material to avoid a mechanical structure inside the electronic device. The antenna module including the third antenna array 533 may be horizontally mounted on a main circuit board 510. The heat dissipation layer 553 extending from at least one of layers of the antenna module including the third antenna array 533 may be coupled to a metal layer of the main circuit board 510.

Figure 6A:
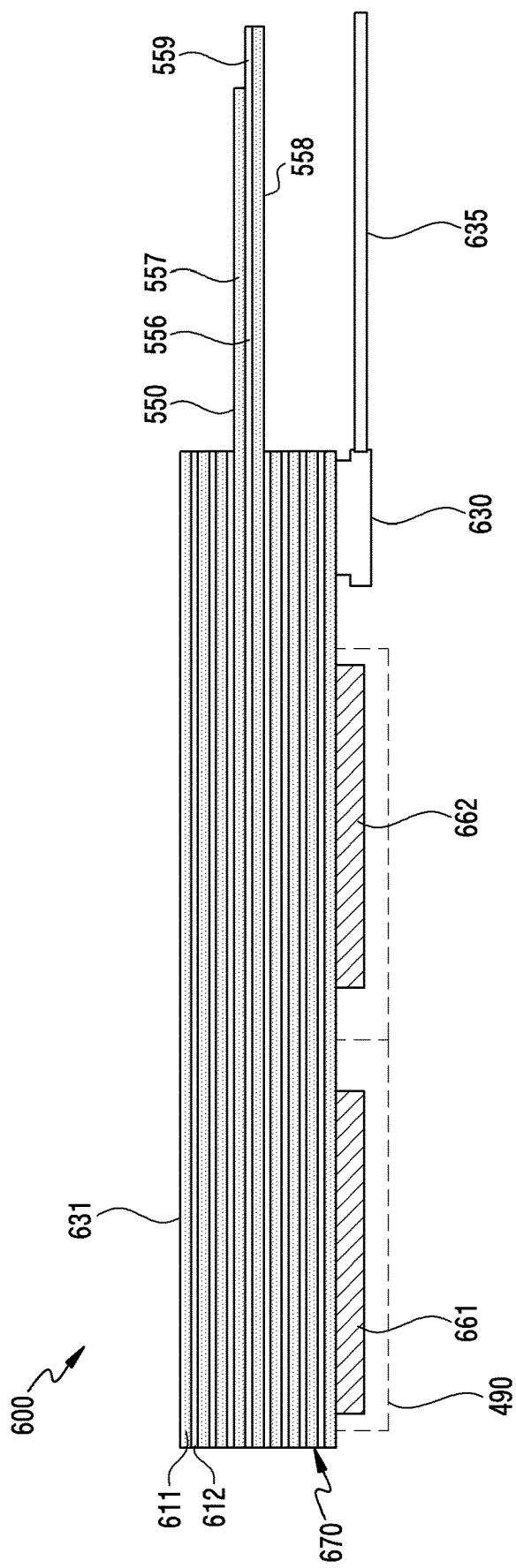
FIG. 6A is a cross-sectional view of an antenna module according to an embodiment of the disclosure.
Figure 6B:
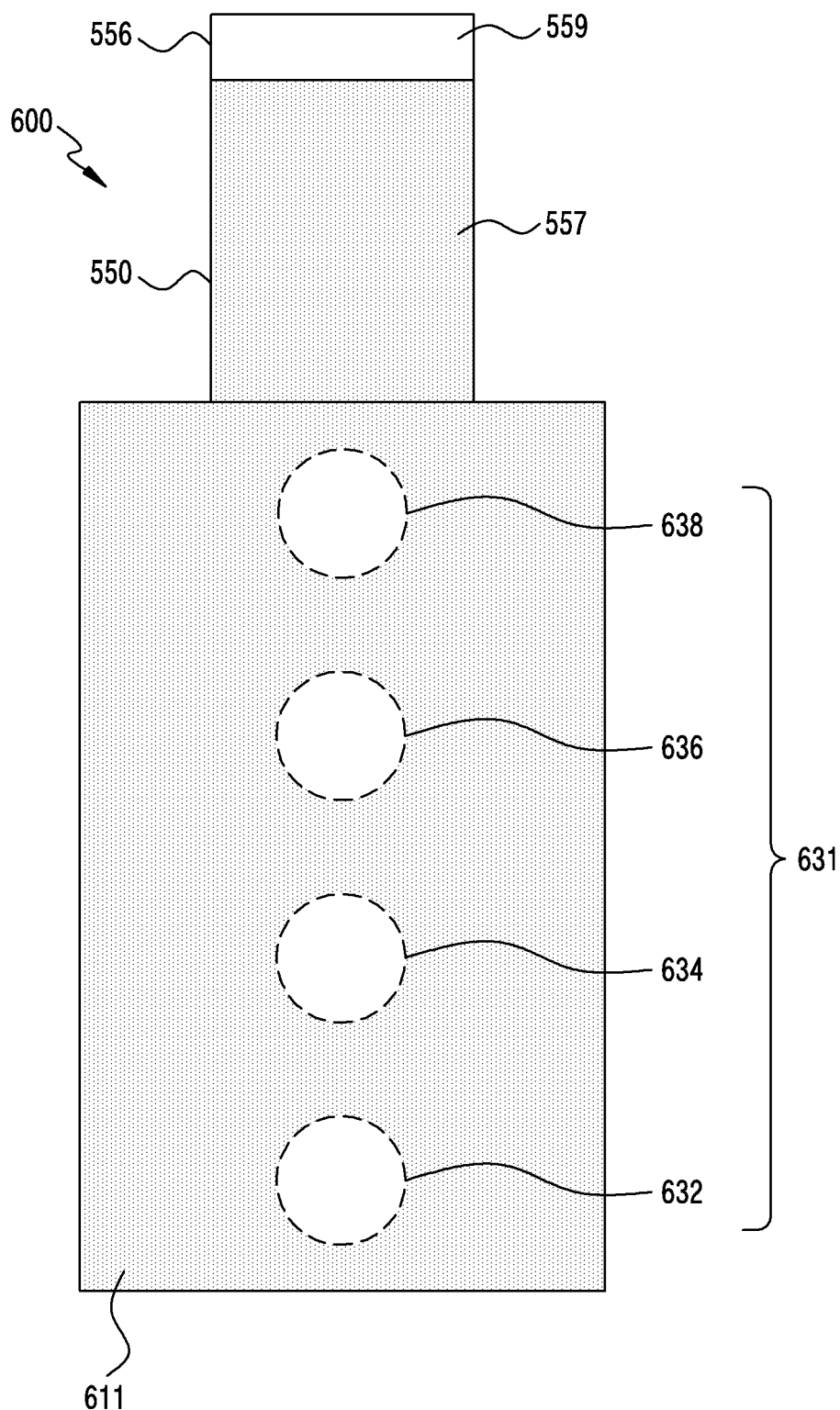
FIG. 6B is a plan view of an antenna module according to an embodiment of the disclosure.

FIG. 6A is a cross-sectional view of an antenna module according to an embodiment of the disclosure. FIG. 6B is a plan view of an antenna module according to an embodiment of the disclosure.

Referring to FIG. 6A and FIG. 6B, an antenna module 600 may include a substrate 670 and an antenna array 631 (e.g., the first antenna array 531, second antenna array 532, or third antenna array 533 of FIG. 5), and may include a first integrated circuit 661 and/or a second integrated circuit 662.

According to an embodiment of the disclosure, the substrate 670 may be constructed of at least one or more layers. When the substrate 670 is constructed of a plurality of layers, the plurality of layers may include a non-conductive layer 611 and a conductive layer 612 stacked alternately with the non-conductive layer 611. According to an embodiment of the disclosure, the non-conductive layer 611 may include a coverlay.

According to an embodiment of the disclosure, the antenna array 631 may include a plurality of antenna elements 632, 634, 636, and 638 (e.g., the plurality of antenna elements 432, 434, 436, and 438 of FIG. 4A). In an embodiment of the disclosure, the antenna array 631 may be constructed on any one layer among the plurality of layers included in the substrate 670. For example, the antenna array 631 may be constructed by patterning on the conductive layer 612. The non-conductive layer 611 may be constructed on the conductive layer 612 or may surround the conducive layer 612. The conductive layer 612 may be disposed between the non-conductive layers 611, may partially construct a conductive pattern to serve as an antenna radiator, and may be partially utilized as a ground layer. The conductive layer 612 may include a copper layer (or a copper foil).

According to an embodiment of the disclosure, the first integrated circuit 661 and/or the second integrated circuit 662 may be disposed on the substrate 670. The first integrated circuit 661 may include an RFIC, and the second integrated circuit 662 may include a PMIC. The first integrated circuit 661 or the second integrated circuit 662 may be disposed on the substrate through conductive bonding, such as soldering. The first integrated circuit 661 or the second integrated circuit 662 may be electrically coupled with the antenna array 631. The first integrated circuit 661 may convert or process a signal transmitted/received by the antenna array 631. The second integrated circuit 662 may receive power from a power management module (e.g., the power management module 188 of FIG. 1), and may manage power supplied to the antenna module 600 by using power to be received. According to an embodiment of the disclosure, since a lot of heat may be generated in data processing and converting, the generated heat may be transferred to a heat dissipation member mounted inside the electronic device.

According to an embodiment of the disclosure, in order for the antenna module 600 to transfer heat to a main heat dissipation layer of a main PCB, an antenna module substrate may be in contact with the heat dissipation member of the electronic device. However, the antenna module 600 may be disposed to an outer periphery of the electronic device, and thus it may be difficult to construct a structure for coupling a heat dissipation member for heat dissipation of an electronic component (e.g., the processor 120 of FIG. 1) mounted on a main board. A structure of a support member for mounting the antenna module 600 may interfere a connection between the heat dissipation member and the antenna module 600.

According to an embodiment of the disclosure, the antenna module 600 may further include a heat transfer member 550. The heat transfer member 550 may include a portion of a conductive layer 556 extending from any one conductive layers among the conductive layer 612 of the antenna module and a portion of non-conductive layers 557 and 558 stacked at both faces of the conductive layer 556 to surround the conductive layer 556. For example, the non-conductive layers 557 and 558 may be attached to the both faces of the conductive layer 556. In an embodiment of the disclosure, the conductive layer 556 may be referred to as a 'conductive member'. In an embodiment of the disclosure, the non-conductive layer 557 and/or the non-conductive layer 558 may be referred to as a 'non-conductive member'.

According to another embodiment of the disclosure, although not shown, the heat transfer member 550 may include a portion of one non-conductive layer. For example, the non-conductive layer may be attached to only one face of the conductive layer 556 or may surround only one face.

According to an embodiment of the disclosure, at least one layer among a plurality of conductive layers included in the substrate 670 may be a ground layer. The ground layer may ground the antenna module 600, and may distribute heat emitted from the antenna module 600.

According to an embodiment of the disclosure, the heat transfer member 550 may be constructed of a soft material. The heat transfer member 550 may include the non-conductive layers 557 and 558 of a polyimide (PI) material and the conductive layer 556 of a copper foil constructed to have ductility. The heat transfer member 550 may be curved or bent depending on an inner structure of the electronic device.

In the heat transfer member 550, the non-conductive layer 557 is partially removed at an end portion 559 so that the conductive layer 556 is partially visible from the outside. The end portion 559 in which the conductive layer 556 is exposed may be in contact with a heat dissipation member (e.g., a heat pipe, a vapor chamber, or a graphite sheet) included inside the electronic device. According to an embodiment of the disclosure, the end portion 559 of the conductive layer 556 may be coupled to a conductive plate of a main PCB (e.g., the PCB 510 of FIG. 5). In the antenna module 600, heat may be transferred to the heat dissipation member through the conductive layer 556 extending from any one layer among the plurality of conductive layers 612. The heat dissipation member may decrease a temperature of the antenna module 600 by distributing the heat generated in the antenna module 600.

According to an embodiment of the disclosure, the heat transfer member 550 may construct a shielding layer to shield an electromagnetic wave as a whole. The end portion 559 of the heat transfer member 550 which is in contact with the heat dissipation member may remove the shielding layer.

According to an embodiment of the disclosure, the antenna module 600 may be coupled with a PCB through a connector 630. The connector 630 may be partially coupled with the antenna module 600, and may be electrically coupled with an electronic component of the PCB through a transmission line 635. An additional connector that can be coupled with the PCB may be further included in an end portion of the transmission line 635.

In an embodiment of the disclosure, the substrate 670 may include a ground layer for grounding the antenna array 631 and the integrated circuits 661 and 662. In an embodiment of the disclosure, at least any one conductive layer among the plurality of conductive layers included in the substrate 670 may serve as the ground layer.

In an embodiment of the disclosure, the at least one ground layer may electrically isolate a region in which the antenna array 631 is disposed and a region in which the integrated circuits 661 and 662 are disposed. For example, the at least one ground layer may prevent the antenna array 631 from being interfered by noise generated by the first integrated circuit 661 and/or the second integrated circuit 662. For another example, the at least one ground layer may prevent the first integrated circuit 661 or the second integrated circuit 662 from being interfered by a signal transmitted/received through the antenna array 631.

Figure 7A:
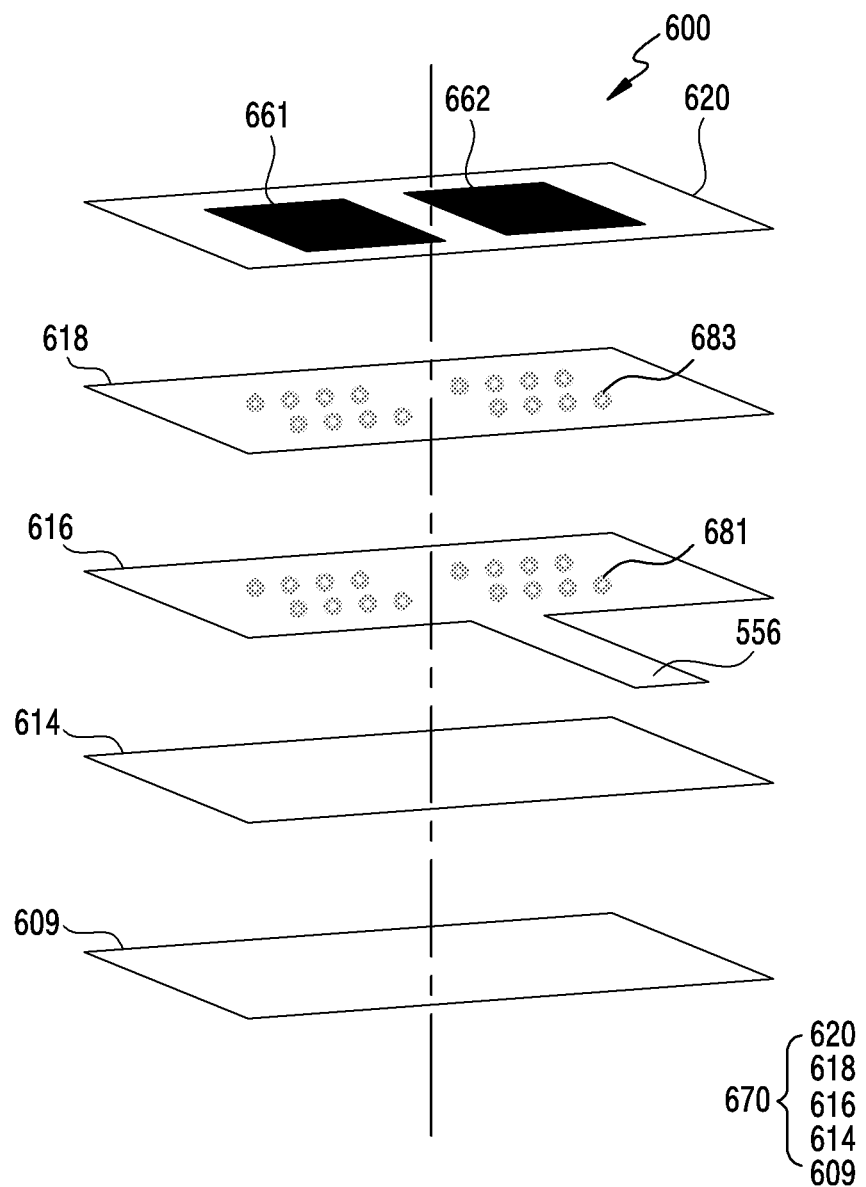
FIG. 7A is an exploded perspective view of an antenna module according to an embodiment of the disclosure.

FIG. 7A is an exploded perspective view of an antenna module according to an embodiment of the disclosure.

Referring to FIG. 7A, an antenna module 600 according to an embodiment may include a substrate 670. The substrate 670 may include a first conductive layer 609, a second conductive layer 614, a third conductive layer 616, a fourth conductive layer 618, and a fifth conductive layer 620. In an embodiment of the disclosure, the fifth conductive layer 620 may include a first integrated circuit 661 and/or a second integrated circuit 662. A non-conductive layer (e.g., the non-conductive layer 611 of FIG. 6A) may be interposed between the plurality of conductive layers 609, 614, 616, 618, and 620.

According to an embodiment of the disclosure, an antenna array (e.g., the antenna array 430 of FIG. 4A, the antenna arrays 551, 552, and 553 of FIG. 5) may be constructed by patterning on the first conductive layer 609 or the second conductive layer 614 among the plurality of conductive layers. The antenna array may serve as an antenna radiator.

According to an embodiment of the disclosure, the third conductive layer 616 and the fourth conductive layer 618 may include conductive vias 681 and 683 so as to be electrically coupled with the first integrated circuit 661 and the second integrated circuit 662.

According to an embodiment of the disclosure, the antenna module 600 may transfer heat generated by the first integrated circuit 661 and the second integrated circuit 662 from the fifth conductive layer 620 to the third conductive layer 616 through the conductive vias 681 and 683. For example, the conductive vias 681 and 683 may serve as thermal vias for performing an operation for transferring heat generated in the integrated circuits 661 and 662 to a heat dissipation member. The third conductive layer 616 may be coupled to a conductive layer 556 of the heat transfer member extending to the outside of the antenna module 600, and the conductive layer 556 may be in contact with the heat dissipation member inside the electronic device. According to another embodiment of the disclosure, unlike the above description, the conductive layer 556 extending from the third conductive layer 616 may be constructed on another conductive layer included in the circuit board 670. For example, the conductive layer 556 may be constructed on the second conductive layer 614 or the fourth conductive layer 618.

In an embodiment of the disclosure, the heat transfer member or the conductive layer 556 may be constructed to have a width which is approximately ½ of an edge of a layer from which the conductive layer 556 extends, but the disclosure is not limited thereto. For example, it may be constructed to have substantially the same width as the edge of the layer from which the conductive layer 556 extends. The width of the conductive layer 556 is not limited thereto, and may be wider depending on an inner space of the electronic device. When the width of the conductive layer 556 increases, heat transfer may be improved, thereby securing excellent heat dissipation performance. According to an embodiment of the disclosure, the width of the heat transfer member or conductive layer 556 may be determined by considering heat dissipation performance or an inner mounting space of the electronic device.

In an embodiment of the disclosure, the substrate 670 may include a ground layer for grounding the antenna array 631 and the integrated circuits 661 and 662.

In an embodiment of the disclosure, at least any one conductive layer among the plurality of conductive layers included in the substrate 670 may serve as the ground layer. For example, the third conductive layer 616 may be a ground layer for grounding the antenna array or the integrated circuits 661 and 662, but the disclosure is not limited thereto.

Figure 7B:
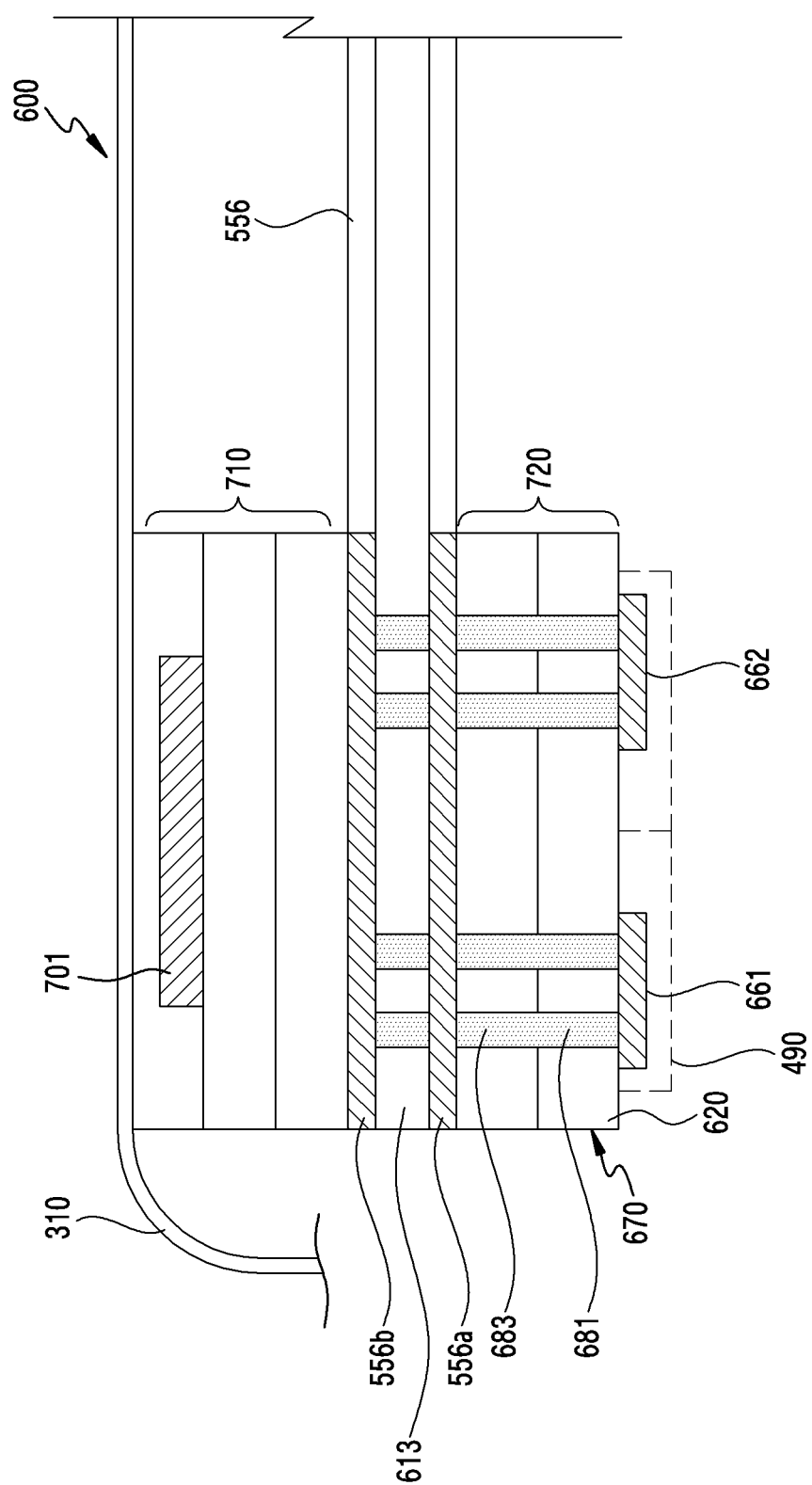
FIG. 7B is a cross-sectional view of an antenna module according to an embodiment of the disclosure.

FIG. 7B is a cross-sectional view of an antenna module according to an embodiment of the disclosure.

Referring to FIG. 7B, the antenna module 600 may include a first region 710 in which an antenna radiator is constructed and a second region 720 in which an integrated circuit is disposed.

According to an embodiment of the disclosure, the first region 710 may have an antenna radiator 701 constructed on at least one layer among a plurality of layers. For example, the antenna radiator 701 may be constructed by patterning on a conductive layer among the plurality of layers. According to an embodiment of the disclosure, the antenna radiator 701 may be constructed on a conductive layer located at an outermost periphery among the plurality of layers of the region 710, for example, a conductive layer closest to a housing 310, and a non-conductive layer (e.g., a coverlay) surrounding the antenna radiator 701 may be constructed on the conductive layer. However, without being limited thereto, unlike the above description, the antenna radiator 701 may be constructed on a conductive layer which is not located at the outermost periphery among the plurality of layers. Although not shown, the antenna module 600 may further include a connection means for electrically coupling the antenna radiator 701 with other components (e.g., the first integrated circuit 661 or the second integrated circuit 662).

According to an embodiment of the disclosure, the antenna module 600 may be disposed to an inner face of the housing 310, and the inner face of the housing 310 may be disposed to be adjacent to the first region 710 of the antenna module 600. The antenna module 600 may be disposed to be adjacent to the inner face of the housing 310. The antenna module 600 may be mounted to a construction extending to an inner portion of the housing 310 or a support member. According to an embodiment of the disclosure, the second region 720 may include the first integrated circuit 661 and the second integrated circuit 662. The first integrated circuit 661 and/or the second integrated circuit 662 may be disposed on the substrate 670. For example, the first integrated circuit 661 and/or the second integrated circuit 662 may be constructed on one face of the fifth conductive layer 620 among the plurality of layers included in the substrate 670.

In an embodiment of the disclosure, the antenna module 600 may include at least one or more conductive layers 556a and 556b between the first region 710 and the second region 720.

According to an embodiment of the disclosure, an insulation layer 613 may be interposed between the conductive layers 556a and 556b. In an embodiment of the disclosure, the insulation layer 613 may be a non-conductive layer (e.g., the non-conductive layer 611 of FIG. 6A). The insulation layer 613 may include a non-conductive material, or may be constructed of the non-conductive material.

According to an embodiment of the disclosure, the conductive vias 681 and 683 which are in contact with a surface of the first integrated circuit 661 or the second integrated circuit 662 may be included. The conductive vias 681 and 683 may be constructed integrally with each other. The conductive vias 681 and 683 may extend from the surface of the first integrated circuit 661 or the second integrated circuit 662 to the conductive layers 556a and 556b by penetrating at least one layer.

According to an embodiment of the disclosure, the conductive vias 681 and 683 may transfer heat generated in the first integrated circuit 661 and the second integrated circuit 662 to the conductive layers 556a and 556b. The heat transferred to the conductive layers 556a and 556b may be distributed to a heat dissipation member or a metal member included in a PCB through the conductive member 556. For example, the conductive vias 681 and 683 may transfer the heat generated in the first integrated circuit 661 and the second integrated circuit 662 to a heat transfer member (e.g., the heat transfer member 550 of FIG. 6A). The conductive vias 681 and 683 may transfer the heat generated in the first integrated circuit 661 and the second integrated circuit 662 to the conductive member 556.

According to an embodiment of the disclosure, at least one conductive layer may include the first conductive layer 556a and the second conductive layer 556b. The heat transfer member (e.g., the heat transfer member 550 of FIG. 6A) may include the conductive member 556 extending from at least one of the first conductive layer 556a and the second conductive layer 556b. In an embodiment of the disclosure, the conductive member 556 may include a first conductive member extending from the first conductive layer 556a and/or a second conductive member extending from the second conductive layer 556b. The insulation layer 613 may be disposed between the first conductive member and the second conductive member. The insulation layer 613 may include a first non-conductive layer (e.g., the non-conductive layer 611 of FIG. 6A) or a coverlay.

Figure 8A:
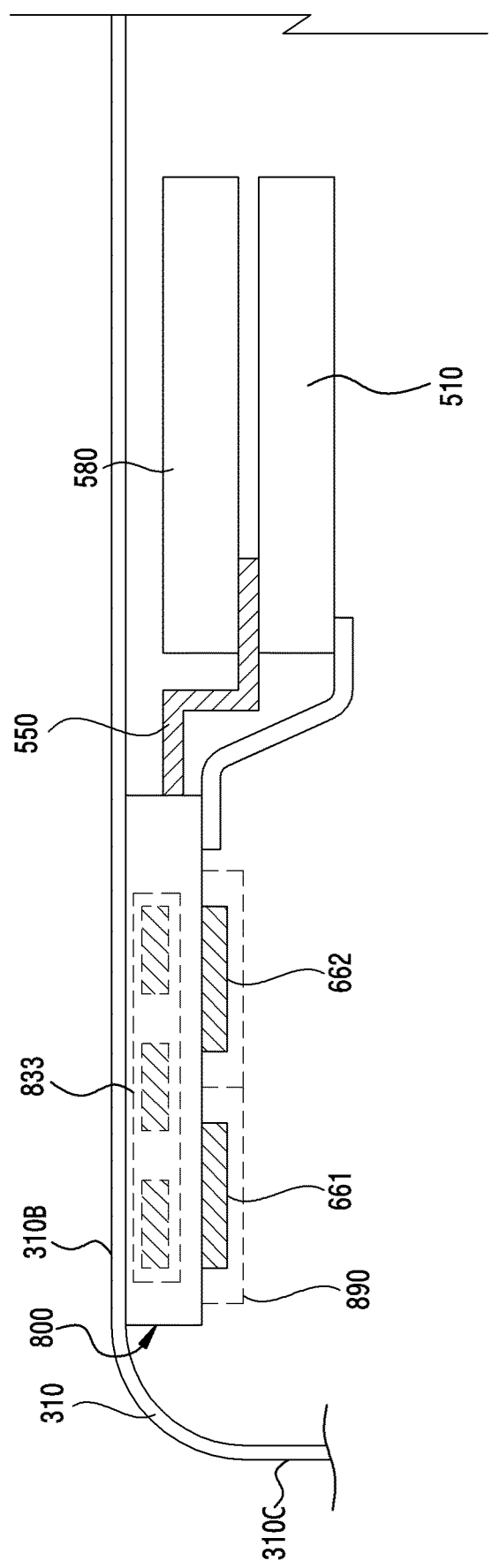
FIG. 8A illustrates an arrangement of an antenna module horizontally mounted according to an embodiment of the disclosure.
Figure 8B:
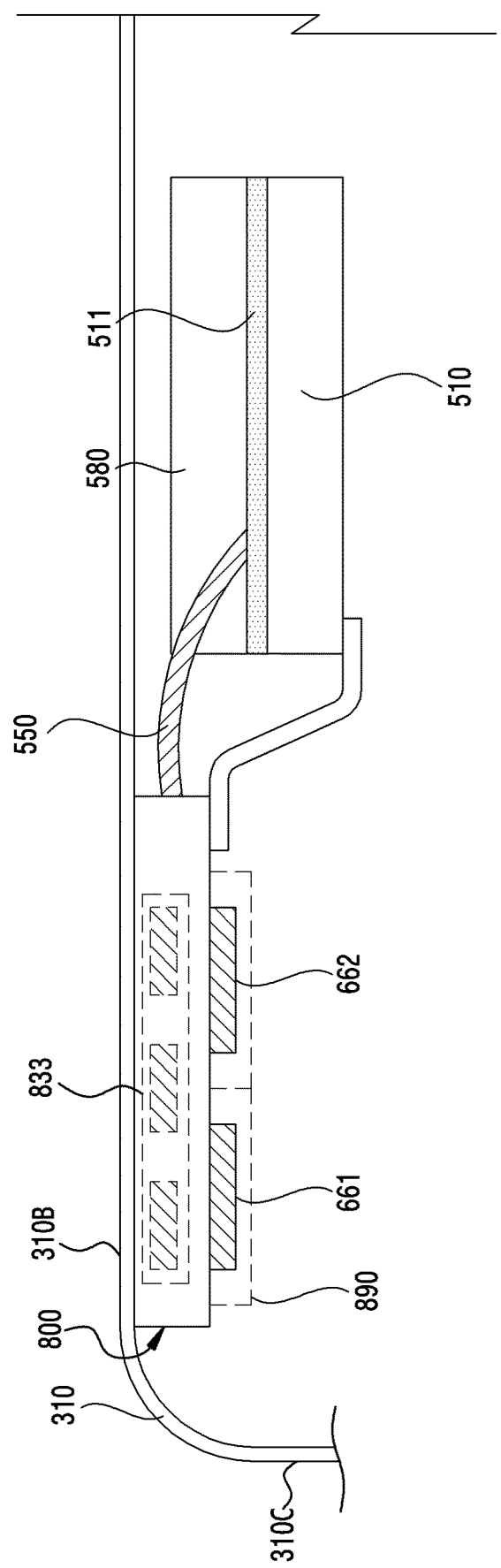
FIG. 8B illustrates an arrangement of an antenna module horizontally mounted according to an embodiment of the disclosure.

FIG. 8A and FIG. 8B illustrate arrangements of an antenna module horizontally mounted according to various embodiments of the disclosure.

Referring to FIG. 8A, an electronic device may include an antenna module 800, a PCB 510 (or a second circuit board), and a heat dissipation member 580.

According to an embodiment of the disclosure, the antenna module 800 may be horizontally mounted inside a housing 310. For example, the antenna module 800 may be disposed such that a wide face of the antenna module 800 is in contact with a rear face 310B of the housing 310. According to an embodiment of the disclosure, the antenna module 800 may include an antenna array 833 (e.g., the third antenna array 533 of FIG. 5). Since the antenna module 800 is horizontally mounted, the antenna array 833 may be disposed in a direction different from the first antenna array 531 and second antenna array 532 of FIG. 5. For example, the antenna array 833 may be disposed such that a wide face of the antenna array 833 faces the rear face 310B of the housing 310. The antenna array 833 may be disposed in parallel with the rear face 310B of the housing 310. The antenna module 800 may be coupled with the PCB 510 through a connector, and a first integrated circuit 661 and second integrated circuit 662 of the antenna module 800 may transmit/receive a signal or power from the PCB 510.

According to an embodiment of the disclosure, the antenna module 800 may include a shielding member 890 surrounding the first integrated circuit 661 and the second integrated circuit 662. The shielding member 890 may be disposed on a face having the first and second integrated circuits 661 and 662 disposed thereon to electrically shield the first integrated circuit 661 and the second integrated circuit 662. In another embodiment of the disclosure, unlike the illustration of FIG. 8A and FIG. 8B, any one of the shielding member surrounding the first integrated circuit 661 and the shielding member surrounding the second integrated circuit 662 may be omitted, or the shielding member surrounding the first integrated circuit 661 and the shielding member surrounding the second integrated circuit 662 may be integrally constructed. According to an embodiment of the disclosure, the shielding member 890 may include a shield can.

According to an embodiment of the disclosure, a heat transfer member 550 may be coupled to the heat dissipation member 580. The heat transfer member 550 may be constructed of a soft material to be bent or curved. A heat dissipation member 580 may include a vapor chamber or a heat pipe. The heat dissipation member 580 may be disposed inside the electronic device to distribute heat generated in a heat source (e.g., a processor or an integrated circuit) mounted on the PCB 510. According to an embodiment of the disclosure, the heat pipe or the vapor chamber may cool the heat source depending on a phase change of liquid or gas existing inside the channel.

According to an embodiment of the disclosure, one end of the heat transfer member 550 may be in contact with the heat dissipation member 580. The antenna module 800 may be thermally coupled with the heat dissipation member 580 through the heat transfer member 550. The antenna module 800 may distribute generated heat, by transferring the heat to the heat dissipation member 580 through the heat transfer member 550. The heat dissipation member 580 may perform cooling of a main heat source and cooling of the antenna module 800.

Referring to FIG. 8B, the heat transfer member 550 may be coupled to a metal member 511 (or a conductive plate) included in the PCB 510. Heat transferred from the antenna module 800 may be distributed in the metal member 511 through the heat transfer member 550.

Figure 9A:
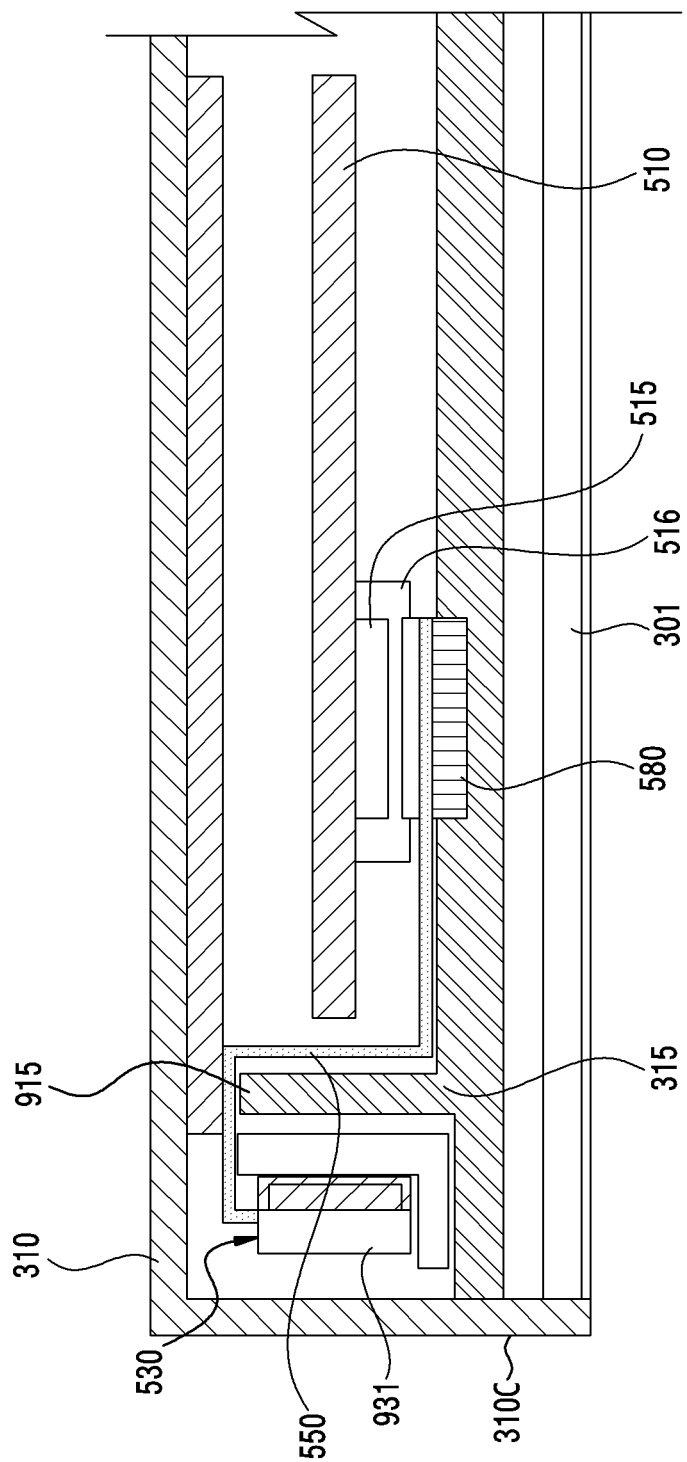
FIG. 9A illustrates an arrangement of an antenna module vertically mounted according to an embodiment of the disclosure.
Figure 9B:
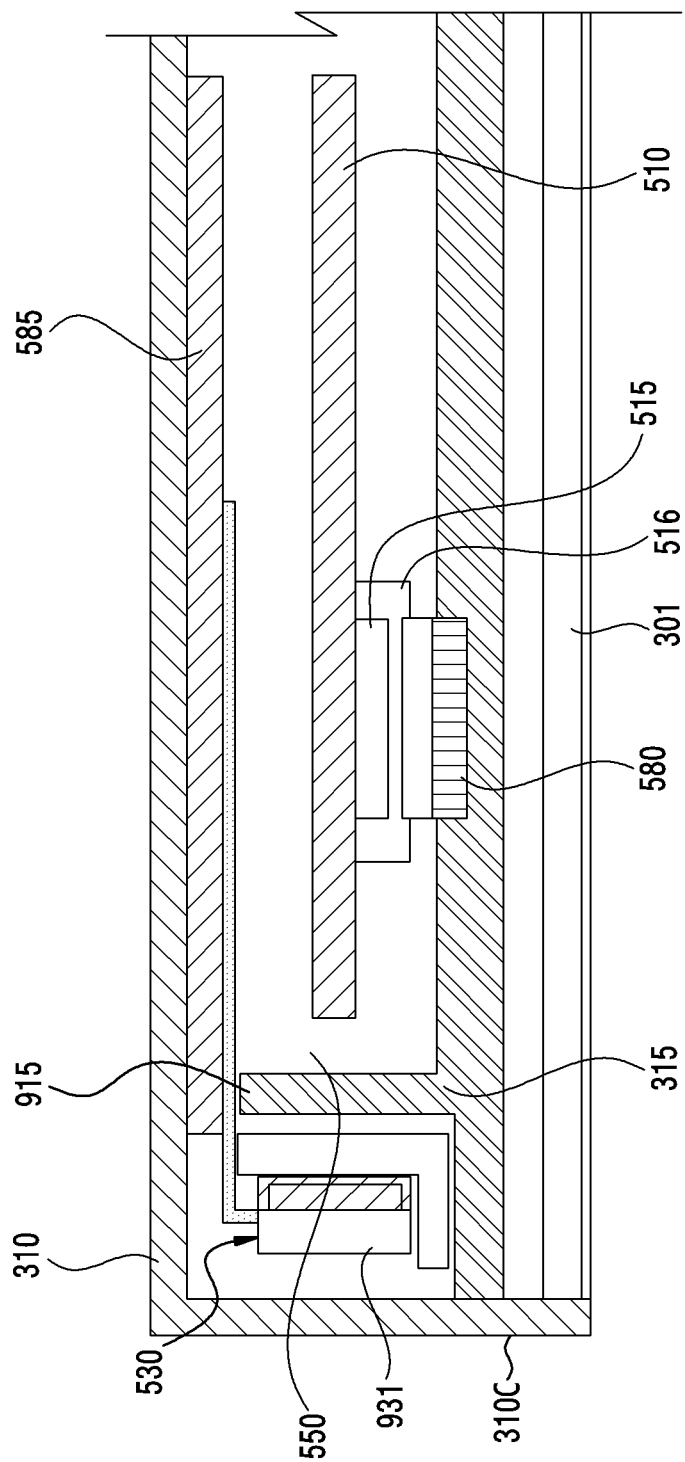
FIG. 9B illustrates an arrangement of an antenna module vertically mounted according to an embodiment of the disclosure.

FIG. 9A and FIG. 9B illustrate arrangements of an antenna module vertically mounted according to various embodiments of the disclosure.

Referring to FIG. 9A, a housing 310 and a display 301 may construct an inner space of an electronic device. A support member 315 extending from the housing 310 may be included in an inner space of the electronic device. The support member 315 may support the antenna module 530. The support member 315 may construct a protrusion 915 at a portion adjacent to an edge of the housing 310 and thus may construct a mounting portion on which the antenna module 530 including an antenna array 931 (e.g., the first antenna array 531 or second antenna array 532 of FIG. 5) can be disposed. The electronic device may include the antenna module 530 including the antenna array 931, a PCB 510, and a heat dissipation member 580. The antenna module 530 may be vertically mounted. For example, the antenna module 530 may be disposed such that an antenna radiator faces a side face 310C of the housing 310. The antenna module 530 may be disposed such that a wide face faces the side face 310C of the electronic device. The antenna module 530 may be disposed such that a wide face of the antenna array 931 faces the side face 310C of the electronic device.

According to an embodiment of the disclosure, a heat transfer member 550 may be bent or curved along the protrusion 915. A PCB may be disposed on the support member 315, and an electronic component 515, such as a processor (e.g., an application processor (AP)) or an integrated circuit may be mounted on the PCB 510. The electronic component 515 may include a shield can 516 for shielding an electromagnetic wave. The heat dissipation member 580 may be disposed to a region in which the electronic component 515 is located, and the heat dissipation member 580 may be in contact with the shield can 516 of the electronic component 515. The heat dissipation member 580 may distribute heat emitted from the electronic component 515. The heat dissipation member 580 may absorb ambient heat in a process in which vapor or liquid therein is subjected to a phase change. According to an embodiment of the disclosure, the heat transfer member 550 may include a conductive layer for transferring heat of the antenna array 931. The heat transfer member 550 may extend along one face of the protrusion 915 of a support, and may extend by being bent at an end portion of the protrusion 915. For example, the heat transfer member 550 may surround the protrusion 915 by being bent along an outer face of the protrusion 915. The heat transfer member 550 may extent along the other face of the protrusion 915. The heat transfer member 550 may be coupled to the heat dissipation member 580 by extending from the protrusion 915 along the support member 315. In an end portion of the heat transfer member 550 coupled to the heat dissipation member 580, a non-conductive layer may be partially removed so that a conductive layer is exposed.

According to an embodiment of the disclosure, heat generated in the antenna module 530 may be transferred to the heat dissipation member 580 through the heat transfer member 550. The heat dissipation member 580 may be shared for heat dissipation of the antenna module 530 and the electronic component 515 attached to the PCB 510.

Referring to FIG. 9B, an electronic device according to an embodiment may have a structure substantially identical or similar to the structure of the electronic device of FIG. 9A. Redundant descriptions on the structure will be omitted.

According to an embodiment of the disclosure, the electronic device may include a coil heat dissipation member 585 for a wireless charging device. The coil heat dissipation member 585 may perform heat dissipation of at least one of a wireless charging coil, near field communication (NFC) coil, and magnetic secure transmission (MST) coil disposed to a rear face. The coil heat dissipation member 585 may be disposed to a rear face (e.g., the second face 310B of FIGS. 3A and 3B) of the housing 310.

According to an embodiment of the disclosure, the heat transfer member 550 may include a conductive layer for transferring heat of the antenna module 530. According to an embodiment of the disclosure, the heat transfer member 550 extending from the antenna module 530 vertically mounted may extend along one face of the protrusion 915. The heat transfer member 550 may extend to the coil heat dissipation member 585 along the rear face of the housing 310 by being bent at one end of the protrusion 915. In the one end of the heat transfer member 550, the conductive layer may be partially removed so that the conductive layer is exposed to the outside.

According to an embodiment of the disclosure, heat emitted from the antenna module 530 may be transferred to the coil heat dissipation member 585 through the conductive layer of the heat transfer member 550. The coil heat dissipation member 585 may be shared for heat dissipation of the wireless charging coil and antenna module 530 of the electronic device.

The heat transfer member of the antenna module according to the aforementioned embodiment may be coupled to a main heat dissipation member included inside the electronic device. The main heat dissipation member may distribute heat generated in the antenna module as well as heat dissipation of an AP. The heat transfer member may be coupled to a member for heat dissipation of a coil, such as the wireless charging coil of the electronic device, and the coil heat dissipation member may distribute heat generated in the antenna module as well as heat of the coil. The antenna module may transfer heat to the heat dissipation member included in the electronic device.

According to an embodiment of the disclosure, an additional heat dissipation member for the antenna module may be included. When the heat dissipation member is located at the rear face of the electronic device, the heat transfer member of the antenna module may extend to the rear face of the electronic device so as to be coupled to the heat dissipation member.

An electronic device according to various embodiments may include a housing, an antenna module disposed along an inner wall of the housing, and a heat dissipation member disposed inside the housing. The antenna module may include a first circuit board including a plurality of layers, wherein the plurality of layers include a plurality of conductive layers and a plurality of non-conductive layers, and the conductive layer and the non-conductive layer are alternately stacked, at least one integrated circuit mounted on the first circuit board, an antenna array disposed on any one of the plurality of layers and electrically coupled with the at least one integrated circuit, and a heat transfer member including a conductive member extending from any one conductive layer among the plurality of conductive layers and a non-conductive member surrounding, at least in part, the conductive member. The heat transfer member may be coupled to the heat dissipation member and is configured to transfer heat generated from the antenna module to the heat dissipation member.

In an embodiment of the disclosure, any one conductive layer among the plurality of conductive layers may include a first conductive layer and a second conducive layer. The conductive member may include a first conductive member extending from the first conductive layer and a second conductive member extending from the second conductive layer.

In an embodiment of the disclosure, the antenna module may include an insulation layer disposed between the first conductive layer and the second conductive layer.

The heat dissipation member may distribute heat of a heat source disposed inside the electronic device. The heat dissipation member may include a heat pipe, a vapor chamber, or a graphite sheet.

In an embodiment of the disclosure, the heat source may include at least one of a display driver integrated (DDI) circuit and a wireless charging coil.

The electronic device according to an embodiment may further include a second circuit board disposed inside the housing. The second circuit board may include a conductive plate. The heat transfer member may be coupled to the conductive plate.

In an embodiment of the disclosure, at least one layer among the plurality of layers may be disposed between the any one conductive layer and the at least one integrated circuit. The antenna module further may include a conductive via which is in contact with part of a surface of the any one conductive layer and part of a surface of the integrated circuit. The conductive via may penetrate the at least one layer.

In an embodiment of the disclosure, the conductive via may transfer heat generated from the integrated circuit to the heat transfer member through the any one conductive layer.

In an embodiment of the disclosure, the electronic device according to an embodiment may further include a support member disposed inside the housing and constructing a protrusion for supporting the antenna module. One face of the antenna module may be in contact with the protrusion.

In an embodiment of the disclosure, the heat transfer member may include a soft material.

In an embodiment of the disclosure, the heat transfer member may extend along one face of the protrusion, and may extend by being bent at an end portion of the protrusion.

In an embodiment of the disclosure, the heat dissipation member may be attached to one face of the housing located in a direction facing the protrusion. The heat transfer member may extend from one end of the protrusion towards the heat dissipation member.

In an embodiment of the disclosure, the heat transfer member may extend along the other face of the protrusion, and may be coupled to the heat dissipation member.

In an embodiment of the disclosure, the conductive member may include a copper thin film. The non-conductive member may include a polyimide (PI) layer surrounding the coper thin film.

In an embodiment of the disclosure, the integrated circuit may include at least one of a radio frequency integrated circuit (RFIC) and a power management integrated circuit (PMIC).

An electronic device according to various embodiments may include a housing, an antenna module disposed along an inner wall of the housing, a heat dissipation member spaced apart from the antenna module and disposed inside the housing, and a first circuit board disposed inside the housing and electrically coupled with the antenna module. The antenna module may include a second circuit board including a plurality of layers, wherein the plurality of layers are constructed of a plurality conductive layers and a plurality of non-conductive layers alternatively stacked with the conductive layers, at least one integrated circuit mounted on the second circuit board, an antenna array disposed to any one layer among the plurality of layers and electrically coupled with the integrated circuit, a first non-conductive layer disposed to at least one face of the any one layer to which the antenna array is disposed, and a heat transfer member including a conductive member extending from any one conductive layer among the plurality of conductive layers and a non-conductive member surrounding, at least in part, the conductive member. The heat transfer member may transfer heat generated from the at least one integrated circuit to the heat dissipation member.

In an embodiment of the disclosure, the any one conductive layer may include a first conductive layer and a second conductive layer. The conductive member may include a first conductive member extending from the first conductive layer and a second conductive member extending from the second conductive layer.

In an embodiment of the disclosure, the antenna module may include an insulation layer disposed between the first conductive layer and the second conductive layer.

In an embodiment of the disclosure, at least one layer among the plurality of layers may be disposed between the any one conductive layer and the integrated circuit. The antenna module may include a conductive via which is in contact with part of a surface of the any one conductive layer and part of a surface of the integrated circuit. The conductive via may penetrate the at least one layer.

In an embodiment of the disclosure, the conductive member may include a copper thin film of a soft material. The non-conductive member may include a polyimide (PI) layer.

Methods based on the embodiments disclosed in the claims and/or specification of the disclosure can be implemented in hardware, software, or a combination of both.

When implemented in software, computer readable recording medium for storing one or more programs (i.e., software modules) can be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the disclosure.

The program (i.e., the software module or software) can be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program can be stored in a memory configured in combination of all or some of these storage media. In addition, the configured memory can be plural in number.

Further, the program can be stored in an attachable storage device capable of accessing the electronic device through a communication network, such as the Internet, an Intranet, a local area network (LAN), a wide LAN (WLAN), or a storage area network (SAN) or a communication network configured by combining the networks. The storage device can have an access to a device for performing an embodiment of the disclosure via an external port. In addition, an additional storage device on a communication network can have an access to the device for performing the embodiment of the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing;
   an antenna module disposed along an inner wall of the housing; and
   a heat dissipation member disposed inside the housing,
   wherein the antenna module comprises:
      a first circuit board comprising a plurality of layers, wherein the plurality of layers comprise a plurality of conductive layers and a plurality of non-conductive layers, and the conductive layer and the non-conductive layer are alternately stacked;
      at least one integrated circuit mounted on the first circuit board;
      an antenna array disposed on any one of the plurality of layers and electrically coupled with the at least one integrated circuit; and
      a heat transfer member comprising a conductive member extending from any one conductive layer among the plurality of conductive layers and a non-conductive member surrounding, at least in part, the conductive member, and
   wherein the heat transfer member is coupled to the heat dissipation member and is configured to transfer heat generated from the antenna module to the heat dissipation member.

2. The electronic device of claim 1,
   wherein the any one conductive layer among the plurality of conductive layers comprises a first conductive layer and a second conducive layer, and
   wherein the conductive member comprises a first conductive member extending from the first conductive layer and a second conductive member extending from the second conductive layer.

3. The electronic device of claim 2, wherein the antenna module comprises an insulation layer disposed between the first conductive layer and the second conductive layer.

4. The electronic device of claim 1, wherein the heat dissipation member distributes heat of a heat source disposed inside the electronic device, and the heat dissipation member comprises a heat pipe, a vapor chamber, or a graphite sheet.

5. The electronic device of claim 4, wherein the heat source comprises at least one of a display driver integrated (DDI) circuit or a wireless charging coil.

6. The electronic device of claim 1, further comprising:
   a second circuit board disposed inside the housing, wherein the second circuit board comprises a conductive plate, and wherein the heat transfer member is coupled to the conductive plate.

7. The electronic device of claim 1, wherein at least one layer among the plurality of layers is disposed between the any one conductive layer and the at least one integrated circuit, wherein the antenna module further comprises a conductive via which is in contact with part of a surface of the any one conductive layer and part of a surface of the least one integrated circuit, and wherein the conductive via penetrates the at least one layer.

8. The electronic device of claim 7, wherein the conductive via transfers heat generated from the least one integrated circuit to the heat transfer member through the any one conductive layer.

9. The electronic device of claim 1, further comprising:

a support member disposed inside the housing and constructing a protrusion for supporting the antenna module, wherein one face of the antenna module is in contact with the protrusion.

10. The electronic device of claim 9, wherein the heat transfer member comprises a soft material.

11. The electronic device of claim 10, wherein the heat transfer member extends along one face of the protrusion, and extends by being bent at an end portion of the protrusion.

12. The electronic device of claim 11, wherein the heat dissipation member is attached to one face of the housing located in a direction facing the protrusion, and wherein the heat transfer member extends from one end of the protrusion towards the heat dissipation member.

13. The electronic device of claim 11, wherein the heat transfer member extends along the other face of the protrusion, and is coupled to the heat dissipation member.

14. The electronic device of claim 10, wherein the conductive member comprises a copper thin film, and wherein the non-conductive member comprises a polyimide (PI) layer surrounding the copper thin film.

15. The electronic device of claim 1, wherein the least one integrated circuit comprises at least one of a radio frequency integrated Circuit (RFIC) or a power management integrated circuit (PMIC).

16. An electronic device comprising:

a housing;

an antenna module disposed along an inner wall of the housing;

a heat dissipation member spaced apart from the antenna module and disposed inside the housing; and a first circuit board disposed inside the housing and electrically coupled with the antenna module, wherein the antenna module comprises:

a second circuit board comprising a plurality of layers, wherein the plurality of layers are constructed of a plurality conductive layers and a plurality of non-conductive layers alternatively stacked with the conductive layers;

at least one integrated circuit mounted on the second circuit board;

an antenna array disposed to any one layer among the plurality of layers and electrically coupled with the least one integrated circuit;

a first non-conductive layer disposed to at least one face of the any one layer to which the antenna array is disposed; and a heat transfer member comprising a conductive member extending from any one conductive layer among the plurality of conductive layers and a non-conductive member surrounding, at least in part, the conductive member, and wherein the heat transfer member transfers heat generated from the at least one integrated circuit to the heat dissipation member.

17. The electronic device of claim 16, wherein the any one conductive layer comprises a first conductive layer and a second conductive layer, and wherein the conductive member comprises a first conductive member extending from the first conductive layer and a second conductive member extending from the second conductive layer.

18. The electronic device of claim 17, wherein the antenna module comprises an insulation layer disposed between the first conductive layer and the second conductive layer.

19. The electronic device of claim 16, wherein at least one layer among the plurality of layers is disposed between the any one conductive layer and the least one integrated circuit, wherein the antenna module comprises a conductive via which is in contact with part of a surface of the any one conductive layer and part of a surface of the least one integrated circuit, and wherein the conductive via penetrates the at least one layer.

20. The electronic device of claim 16, wherein the conductive member comprises a copper thin film of a soft material, and the non-conductive member comprises a polyimide (PI) layer.

* * * * *